United States Patent [19]
Lachenmaier et al.

[11] Patent Number: 5,512,790
[45] Date of Patent: Apr. 30, 1996

[54] TRIAXIAL DOUBLE SWITCH MODULE

[75] Inventors: Frank D. Lachenmaier, Kokomo; Donald E. Lake, deceased, late of Rochester, by Juanita Lake, administrator; Timothy D. Martin; John D. Tagle, both of Kokomo; Lisa A. Viduya, Carmel, all of Ind.

[73] Assignee: Delco Electronics Corporation, Kokomo, Ind.

[21] Appl. No.: 278,199

[22] Filed: Jul. 21, 1994

[51] Int. Cl.⁶ .................................................. H01L 25/07
[52] U.S. Cl. ........................... 307/112; 307/140; 200/1 R; 200/11 DA; 327/365
[58] Field of Search ........................... 307/112, 140; 200/1 R, 5 R, 5 EB, 8 R, 11 DA; 327/365; 29/622; 257/678

[56] References Cited

U.S. PATENT DOCUMENTS

| | | | |
|---|---|---|---|
| 3,714,709 | 2/1973 | Liederbach | 29/626 |
| 4,583,005 | 4/1986 | Bevans | 307/115 |
| 5,365,108 | 11/1994 | Anderson et al. | 257/678 |
| 5,444,295 | 8/1995 | Lake et al. | 257/678 |

OTHER PUBLICATIONS

Power Package Purges Wire Bonds & Their Inductance (Electronic Design Jul. 22, 1993 No. 15 p. 35.
U.S. Ser. No. 08/117,924 filed Jul. 7, 1993 to Alhoussami et al.
U.S. Ser. No. 08/116,793 filed Jul. 7, 1993 to Eytcheson, et al.
U.S. Ser. No. 08/118,112 filed Sep. 7, 1993 to Alhoussami, et al.
U.S. Ser. No. 08/208,244 filed Mar. 9, 1994 to Eytcheson, et al.
U.S. Ser. No. 08/233,572 filed Apr. 26, 1994 to Eytcheson, et al.
U.S. Ser. No. 08/195,659 filed Feb. 14, 1994 to Eytcheson, et al.

Primary Examiner—William M. Shoop, Jr.
Assistant Examiner—Albert W. Paladini
Attorney, Agent, or Firm—Mark A. Navarre

[57] ABSTRACT

A low inductance triaxial semiconductor switching module. The module permits high power semiconductor switching devices to operated at high frequency but with low inductance. The module incorporates compositional, geometrical and electrical symmetry in connection with a triaxial terminal subassembly having coplanar contact areas. The terminal subassembly is readily fabricated and assembled into the module. The module also includes short internal leads, a special circumferential array of substrates subassemblies, and a circular circuit board having gate and Kelvin circuit patterns.

20 Claims, 8 Drawing Sheets

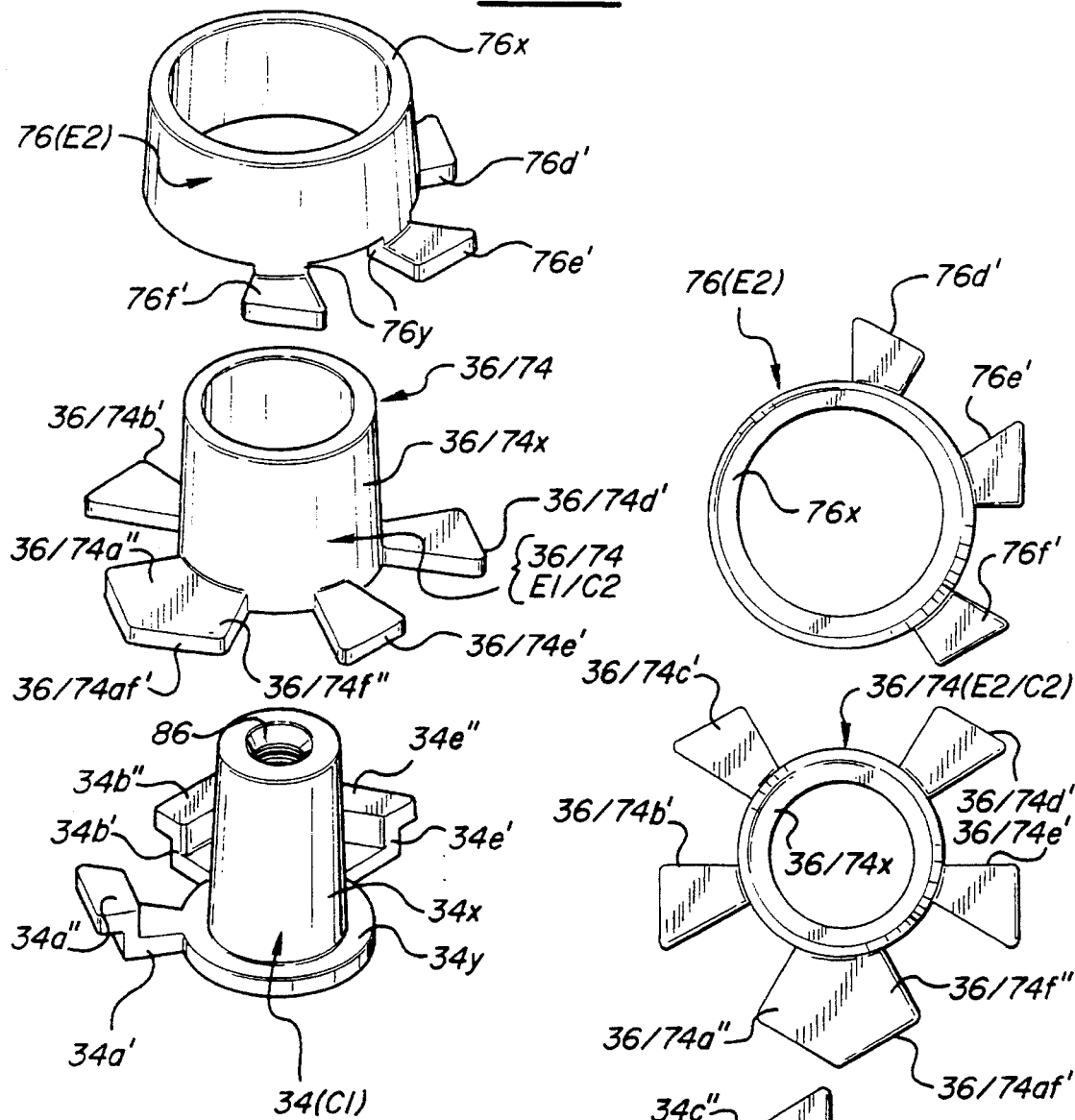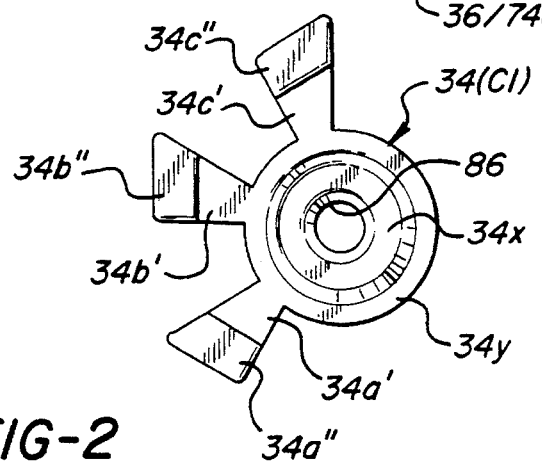

TRIAXIAL DOUBLE SWITCH MODULE

RELATED PATENT APPLICATIONS

This patent application is related to the following patent applications, all of which are assigned to the assignee of this patent application and incorporated herein by reference:

U.S. patent application Ser. No. 08/117,924 entitled "High Power Semiconductor Switch Module" filed Sep. 7, 1993.

U.S. patent application Ser. No. 08/116,793 entitled "Coaxial Switch Module", filed Sep. 7, 1993.

U.S. Pat. No. 5,444,295 issued Aug. 22, 1992, entitled "Linear Dual Switch Module".

U.S. patent application Ser. No. 08/118,112 also filed Sep. 27, 1993 entitled "Substrate Subassembly and Method of Making Transistor Switch Module".

U.S. patent application Ser. No. 08/233,572 filed Apr. 26, 1994 entitled "Electron and Laser Beam Welding Method and Apparatus".

U.S. patent application Ser. No. 08/195,659 filed Feb. 14, 1994 titled "Coplanar Linear Dual Switch Module".

FIELD OF THE INVENTION

This invention relates to packaging of a high voltage/high current/high frequency semiconductor switching device. In a preferred embodiment, this invention relates to a power module containing two groups of electrically paralleled high voltage and high current semiconductor switching devices that are operated at high frequency. The switching devices are arrayed around a unique circular terminal subassembly that has three concentric members on a common axis, which we refer to as triaxial.

BACKGROUND OF THE INVENTION

The above-mentioned related U.S. patent application U.S. Ser. Nos. 08/117,924, 08/116,793, 08/195,659, and U.S. Pat. No. 5,444,295 disclose a substrate subassembly that includes a metallized thin rectangular ceramic substrate having two semiconductor chips thereon and an integral thin metal connector tab extending from one of the metallized surfaces. In a preferred embodiment, one surface of a second ceramic wafer is bonded to the metallized wafer surface that has the tab. The opposite surface of the second wafer is metallized, and also has a tab extending therefrom. More specifically, the wafers are of beryllium oxide and the metallizations are copper foil sheets bonded to the wafer surface. The tabs are integral extensions of the copper foil sheets beyond the wafer edge.

The bonded copper foil sheets become copper foil layers in a composite substrate. The copper foil layers are bonded to the opposed major surfaces of the beryllium oxide wafers by direct copper bonding. Direct copper bonding is a known technique by which copper oxide is used to bond copper metal to a ceramic.

The semiconductor chips are bonded to one of the copper foil layers, preferably by soldering, to form a resultant substrate subassembly. As indicated above, the copper foil layer to which the chips are soldered, has an integral tab portion that overhangs the beryllium oxide wafer edge. The tab projects out from the beryllium oxide wafer a short distance, but a distance long enough to permit easy attachment to a cooperating terminal member for the region of each chip contacting the copper foil layer. The tab, thus, provides an integral connector portion between that copper foil and the terminal member. In the preferred five layer substrate subassembly, upper surface portions of the chips are "wire bonded" to the top copper foil layer. The tab on the top copper foil layer connects to a second terminal member, to provide low resistance communication between the second terminal member and the upper surfaces of the chips.

The substrate subassembly, as well as its manufacture and function, is the subject matter of U.S. patent application Ser. No. 08/118,112. Use of substrate subassemblies in modules is described and claimed in U.S. patent application Ser. No. 08/117,924. A coaxial single switch module having such substrates is the subject matter of U.S. patent application Ser. No. 08/116,793. A linear dual switch module having such substrates is the subject matter of U.S. patent application Ser. No. 08/118,112. A coplanar linear dual switch module having a special composite terminal subassembly is the subject matter of U.S. patent application Ser. No. 08/195,659. A special electron beam or laser beam welding technique, for bonding the copper foil tabs (of the substrate subassembly) to a terminal member, is the subject matter of U.S. patent application Ser. No. 08/233,572. The subject patent application is an improvement on U.S. patent application Ser. No. 08/116,793.

Before discussing this application's improvements over U.S. patent application Ser. No. 08/116,793, basic features of the latter application shall be reviewed.

U.S. patent application Ser. No. 08/116,793 focuses its description on packaging insulated gate bipolar transistors (IGBTs). IGBTs are extremely attractive semiconductor devices for power applications. An IGBT is more attractive than a power-type insulated gate field effect transistor (IGFET), which is popularly referred to as a MOSFET. An IGBT can handle both high voltages and high currents with small die size and with relatively low "on" resistance. In addition, an IGBT can be switched rapidly, making IGBTs potentially useful as switches in a three phase inverter for a high power alternating current motor application.

On the other hand, the high current density capability and low "on" resistance of the IGBT also present new challenges. The possibility of device failure is aggravated when the IGBT is handling high power. By high power, we mean current densities above about 135 amps per square centimeter of active chip area, at hundreds of volts. By high frequency switching we mean on/off frequencies above about 18 kilohertz, as for example 30 kilohertz. As might be expected, significant impedance, material and mechanical problems are encountered in handling such power at high frequencies and low resistances. This is especially true for a high power/high frequency module, in which several such IGBTs are electrically paralleled. Heretofore, the foregoing problems have been so difficult that not many high power/high frequency IGBT modules have been commercially manufactured. Those that were made thus far, have been made in relatively low volume, where each module could be individually specially crafted.

The prior U.S. patent application Ser. No. 08/116,793 describes a high frequency/high power coaxial-type module that is capable of being manufactured on a commercial production basis. By commercial production basis, we mean production volumes such as used in the automotive industry. The high power/high switching frequency IGBT modules of the prior U.S. patent application Ser. No. 08/116,793 (5922-00010; H-172190) have high efficiency and high durability, but are still economically manufacturable in automotive-type high volumes.

The prior U.S. patent application Ser. No. 08/116,793 suggests integrating module terminal members into a premolded subassembly for a single switch, and that coplanar contacts would be desirable. The subject patent application takes that suggestion further. It provides a unique premolded subassembly of three concentric members for a double switch, not of two members for a single switch. In the subject three member subassembly, the members are concentric and have interdigitated finger flanges. In addition, the interdigitated finger flanges of our unique terminal member subassembly have coplanar tips that comprise coplanar terminal contact areas for connection with coplanar connector tabs on the substrate subassemblies in the module. Still further, the premolded terminal subassembly is pretestable, and easily assembled into the module. This increases speed and simplicity of assembly. It also allows an increase in both production speed and yield. Also, our unique premolded terminal subassembly is designed to allow module pretesting at full operating power before final packaging steps are completed. This latter pretesting allows the discarding or repair of substandard modules at a readily fixable stage, and before more value is added. Discarding or repair of module parts before assembly, or of the module itself in early stages of assembly, of course, helps reduce manufacturing costs and overall device quality and durability.

Further, with coplanar terminal contact areas and coplanar substrate subassembly coplanar tab ends for all switches in the module, all terminal connections for any switch or group of switches can be made in a single welding operation. This allows the electron and laser beam welding concepts of the above-mentioned U.S. patent application Ser. No. 08/233, 572 to be more fully utilized. This additional utilization, provides a still further manufacturing advantage. We refer to our unique subassembly of three concentric center terminals for a double switch module as triaxial. We believe that our triaxial terminal member subassembly, and our methods of making the subassembly and incorporating it into the module, are quite applicable to high volume and demanding applications. Such applications would include, for example, automotive electric vehicle inverter commercial production applications.

Moreover, our unique triaxial terminal member subassembly helps provide a module of high efficiency and high durability, but economically manufacturable at high volumes.

OBJECTS AND SUMMARY OF THE INVENTION

It is therefore a principal object of this invention to provide a subassembly of at least three concentric terminal members on a common axis for use in a module for handling high power electrical currents at high frequencies.

Another object is to provide a module having a triaxial terminal subassembly that has coplanar contact areas connected to coplanar connector tabs on switching transistor subassemblies.

Another object of this invention is to provide methods of making a multiaxial terminal subassembly for a high power module, and assembling it into the module. By multiaxial, we mean at least three concentric members on a common axis.

These and other objects of the invention are achieved in a module having at least two groups of active switching devices that are interconnected with a high degree of compositional, geometrical, and electrical symmetry. In addition, electrical leads are preferably kept extremely short, to reduce parasitic impedance effects.

In the double switch embodiment of this invention disclosed herein, input and output terminals for two groups of IGBTs are arranged substantially concentrically. One of the two power terminals for each group can be shared, resulting in a need for only three power terminals. The three power terminals are made as a special pre-testable concentric subassembly that we call triaxial. The triaxial subassembly not only has concentric center portions but also flange-like portions that are interdigitated. The outer ends of the interdigitated flange portions are like interdigitated fingers, with the fingers tips being coplanar. The coplanar finger tips are electrically connected to coplanar ends of connector pairs for two groups of matched IGBTs. The matched IGBTs are symmetrically circumferentially arrayed around the triaxial terminal subassembly, in close radial proximity to said finger tips.

BRIEF DESCRIPTION OF THE DRAWING

FIG. 1 shows a perspective exploded view of the three concentric power terminal members of the unique terminal subassembly of this invention.

FIG. 2 shows a top plan view of the exploded three concentric power terminal members shown in FIG. 1.

DESCRIPTION OF THE PREFERRED EMBODIMENTS OVERVIEW DESCRIPTION

Figure 3:
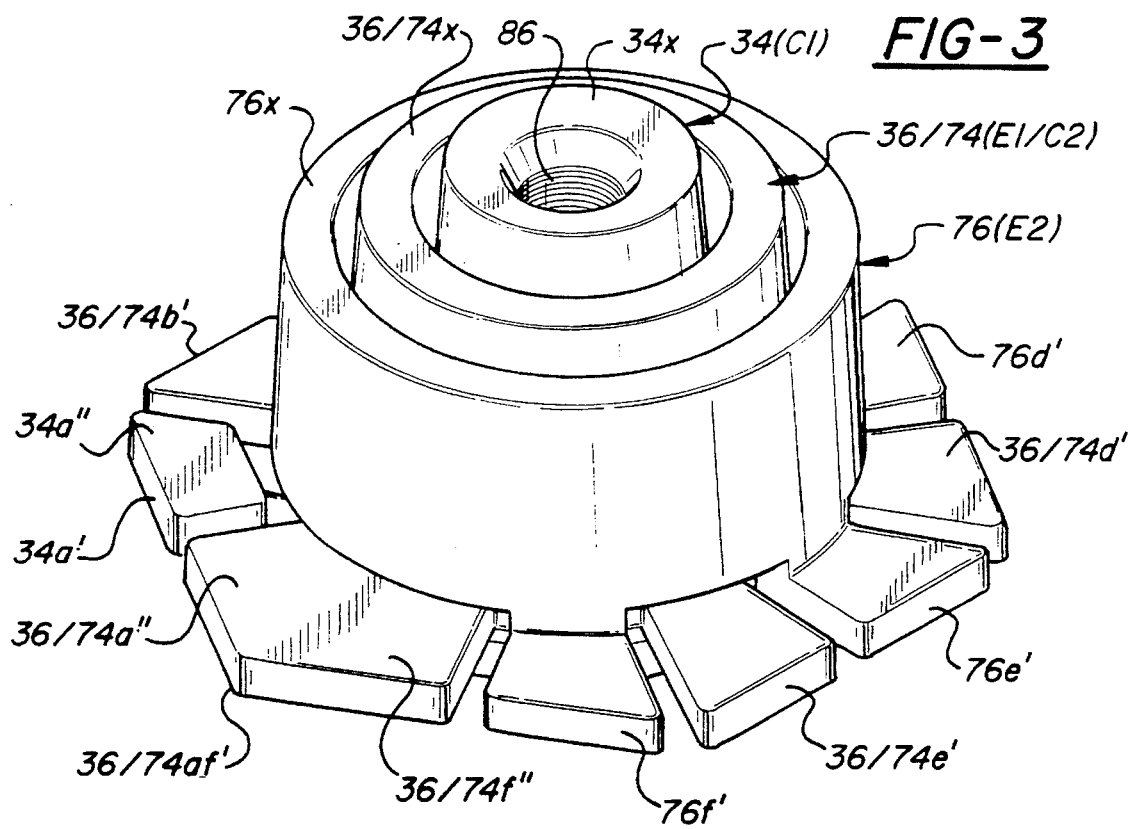
FIG. 3 shows a perspective view of the three concentric power terminal members shown in FIGS. 1–2 as assembled as a triaxial group for use.

Before proceeding to a specific description of the triaxial terminal member subassembly of FIGS. 1–5, some background information from the afore-mentioned related patent applications should be discussed. For example, our triaxial terminal member subassembly incorporates the basic functions and features of the terminal members in the prior modules of related patent applications U.S. Ser. No. 08/117,924, U.S. Ser. No. 08/116,793 and U.S. Ser. No. 08/118,112. In addition our triaxial terminal member subassembly is designed preferably for use in combination with the five layer composite substrate disclosed and claimed in related U.S. patent application Ser. Nos. 08/118,112, 08/233,572. The five layer composite substrate is part of each switching transistor substrate subassembly shown in FIGS. 6–9 of the drawing for this patent application. Each one is indicated by general reference numeral 10. There are six. Each of the five layer substrate subassemblies 10 of FIGS. 6–9 hereof comprises upper and lower dielectric layers 12 and 13 that are metallized on their outer and facing surfaces. The lower dielectric layer 12 comprises a 21 millimeters by 14.5 millimeters beryllium oxide plate or wafer 12 of about 1 millimeter in thickness. Beryllium oxide is a particularly effective dielectric material for use in this application. It has a high thermal transfer coefficient but has a thermal expansion coefficient similar to that of silicon. Aluminum oxide and aluminum nitride also generally match silicon in thermal expansion characteristics. However, beryllium oxide has a thermal transfer coefficient considerably higher. In such instance, the beryllium oxide wafer 12 can be made correspondingly thicker than if made of competing materials. This, in turn, reduces parasitic capacitance between its upper and lower surfaces, which are metallized, as hereinafter described. We also hereinafter describe the metallized wafer as soldered to the surface of an electrically conductive bottom plate, or baseplate, for a module housing.

Regardless of the size of the housing, or the number of switching transistors disposed in the housing, the beryllium wafer 12 is only big enough to support one switching transistor and necessary associated circuitry, such as for thermal tracking or other symmetry purposes. This reduces the area of the metallized surfaces on wafer 12 supporting the switching transistor, which further reduces parasitic capacitance.

The beryllium wafers 12 and 13 are metallized as follows. A copper foil plate 14 and a copper foil plate 16 are disposed on opposite faces of the lower beryllium oxide wafer 12. In this example, copper layer 14 is an upper layer on wafer 12 when in use. Copper plate 14 has outwardly extending integral connector tab 14a that can be seen in FIGS. 6–9. Copper foil plates 14 and 16 are each about 20 millimeters by 13.5 millimeters and are about 0.25 millimeter thick. They are secured to the opposite major surfaces of the lower beryllium oxide wafer 12 by any acceptable technique, as for example, by direct copper bonding. Direct copper bonding is a known and accepted practice in which copper oxide is used to bond a copper sheet to a ceramic substrate. Integral generally rectangular extension 14a is about 6–9 millimeters wide and about 13.3 millimeters long. Accordingly it overhangs the lower beryllium oxide wafer 12 by about 12.8 millimeters. The exposed portions of the copper foil layer 14, excluding tab 14a, have a 6.35–10.2 micron silver coating thereon to enhance solderability. Copper layer 16 is similar to copper layer 14, except that it has not connector tab. It is similarly bonded to beryllium oxide wafer 12, preferably concurrently.

As indicated above, the five layer substrate subassembly 10 of FIGS. 6–9 also includes an upper beryllium oxide wafer 13. It is bonded to the upper copper layer 14 on lower wafer 12. A third copper foil layer 15 is, in turn, bonded to the upper surface of upper beryllium oxide wafer 13. Thus, copper foil layer 14 becomes a middle copper foil layer in the resulting five layer substrate. The hereinbefore-mentioned U.S. patent application Ser. No. 08/118,112 teaches that the upper dielectric layer 13 can assume many configurations. It can be a full wafer with apertures in it that expose copper foil layer 14. The semiconductor chips would be soldered to copper foil layer 14 within the apertures. The latter patent application also discloses that upper dielectric layer 13 need only be a bar of dielectric along one long edge of the lower wafer 12, as shown in FIGS. 6–9 hereof.

It is convenient and preferred at this time to make the upper dielectric layer 13 of a ceramic, most preferably of a beryllium oxide bar about one millimeter thick. Its length is about 21 millimeters and its width is about 3–6 millimeters. Accordingly its length is about the same as the lower the beryllium oxide wafer 12. Its width is wide enough to allow "wire bonds" to be conveniently made to it. However, its width is small enough to expose a sufficient surface area of middle copper foil layer 14 on which to mount a switching IGBT chip 18, an SFD chip 20, a resistor chip 32 and, if needed, a wire bond plate 22 for a Kelvin contact to copper foil layer 14.

Figure 6:
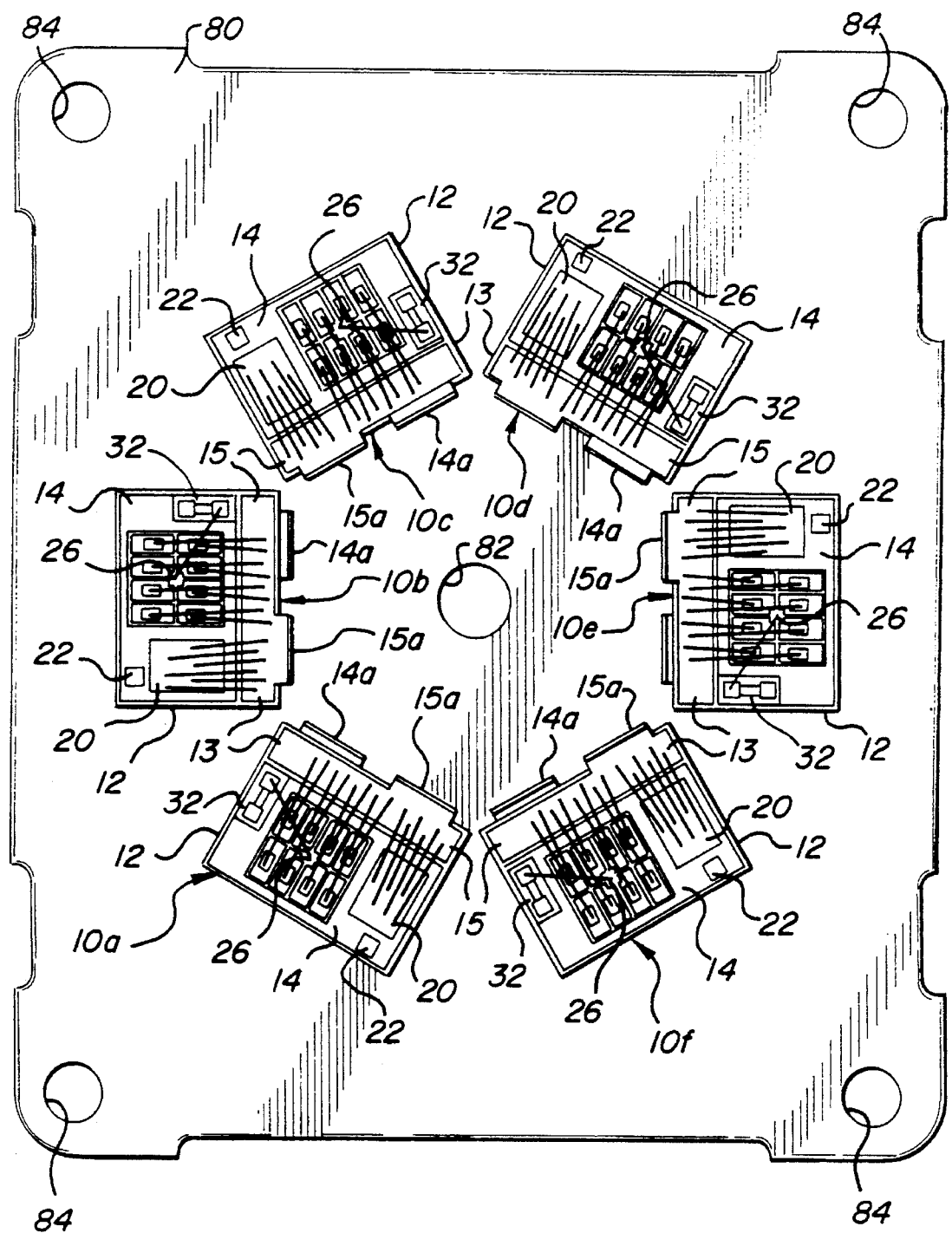
FIG. 6 show a top plan view of a baseplate for a semiconductor inverter module, with power switching transistor substrate subassemblies affixed thereto in a circular array.

The top copper foil layer 15 is about 0.25 millimeter thick and is contoured to match the contours of the second or upper dielectric layer 13. Hence, its length is about 20 millimeters and its width is about 3–5 millimeters. More specifically, it is preferably about 1 millimeter less in width and length than the width and length of top dielectric layer 13. However, top copper foil layer 15 also includes a tab portion 15a that overhangs top dielectric layer 13, analogous to the overhang of tab 14a. Except for being offset from tab 14a and being slightly shorter than tab 14a, tab 15a is quite similar. Accordingly, its width is about 6–9 millimeters and its length is about 13.3 millimeters, which gives it an overhang of about 12.8 millimeters. The overhangs can vary, depending on the location and relative level of the lateral terminal contact surfaces to which these tabs are to be connected. In our invention, we provide a line of lateral contact surfaces. Thus, we prefer that the lengths of tabs 14a and 15a be such that they overlap onto this line a generally similar amount for similar and concurrent bonding. Such a length might actually make them of unequal lengths when bent upwardly as depicted in FIG. 6. It should be mentioned that direct copper bonding is also preferably used to bond top dielectric layer 13 to the upper surface of middle copper foil layer 14 and to the lower surface of top copper foil layer 15. Preferably, all bonds are made concurrently. The result is a composite substrate of very distinctive properties. When the electrical components are added to it, we refer to the resultant product as a substrate subassembly.

As indicated, a beryllium oxide wafer of 1 millimeter thickness is preferred for dielectric bar 13. However, dielectric bar 13 need not necessarily be of this thickness, and it need not necessarily be of beryllium oxide. In fact, it may not even be necessarily that it be a discrete wafer, as will hereinafter be explained.

It is preferred that the composite substrate of substrate subassembly 10 have a thermal coefficient of expansion approaching that of silicon. That is why beryllium oxide is used for the beryllium oxide wafer. If the upper dielectric layer 13 is to be of a ceramic other than beryllium oxide, we would prefer that the alternative ceramic material would have a thermal coefficient of expansion similar to that of beryllium oxide, i. e., similar to silicon. One such alternative material is aluminum oxide. Since this layer may not have as active a role in thermal transfer as lower ceramic layer 12, aluminum oxide might turn out to be quite satisfactory for layer 13. Other materials might work as well, depending on the application. Ceramic may not even have to be used, especially if the alternative material had a compatible coefficient of expansion with silicon. If not, we prefer that the alternative material be thin enough not to adversely affect the preferred coefficient of expansion of the resultant composite substrate.

On the other hand, one also has to be concerned that the dielectric layer 13 be thick enough not to be detrimentally affected by "wire bonding". As mentioned, switching transistor chip 18 is mounted on middle copper foil layer 14. This places its lower surface, its collector, in low resistance contact with layer 14. The upper surface of chip 18 contains eight rectangular aluminized emitter contact areas. These aluminized emitter contact areas are placed in low electrical resistance contact with layer 15 by "wire bonding". In such instance, at least one filamentary wire is thermocompression or ultrasonically bonded between each emitter contact area of switching transistor chip 18 and top copper foil layer 15. In such instance, the ends of filamentary wires are attached to the copper foil layer 15 over ceramic layer 13 by techniques that subject these layers to localized high pressures. Ceramic layer 12 can be a coating or a wafer. However, the coating or wafer has to be strong enough to withstand such bonding techniques. If dielectric layer 13 is a coating or wafer that is too thin, the "wire bonding" techniques can possibly fracture it, and cause an immediate, or subsequent, electrical short between copper foil layers 14 and 15. On the other hand, chip 18 might be connected to the top copper foil layer 15 by techniques that do not subject dielectric layer to such high localized pressures. For example, switching transistor chip 18 could be pre-bonded to inner ends of a convergent finger connector pattern, such as in tape automated bonding. The outer ends of the convergent fingers could be attached to top copper foil layer 15 by a lower pressure bonding technique, such as soldering or lower pressure thermocompression tape bonding. In such instance, it is conceivable that upper dielectric layer 12 could be formed of other materials, in other thicknesses, and by other techniques. In such instance, upper copper foil layer 15 could be bonded to dielectric layer 13 by other techniques. In such further instance, upper copper layer 15 might integrate the convergent finger lead pattern. In any event, these alternative examples are given to illustrate that deviations might be possible from the preferred embodiments described herein.

Figure 8:
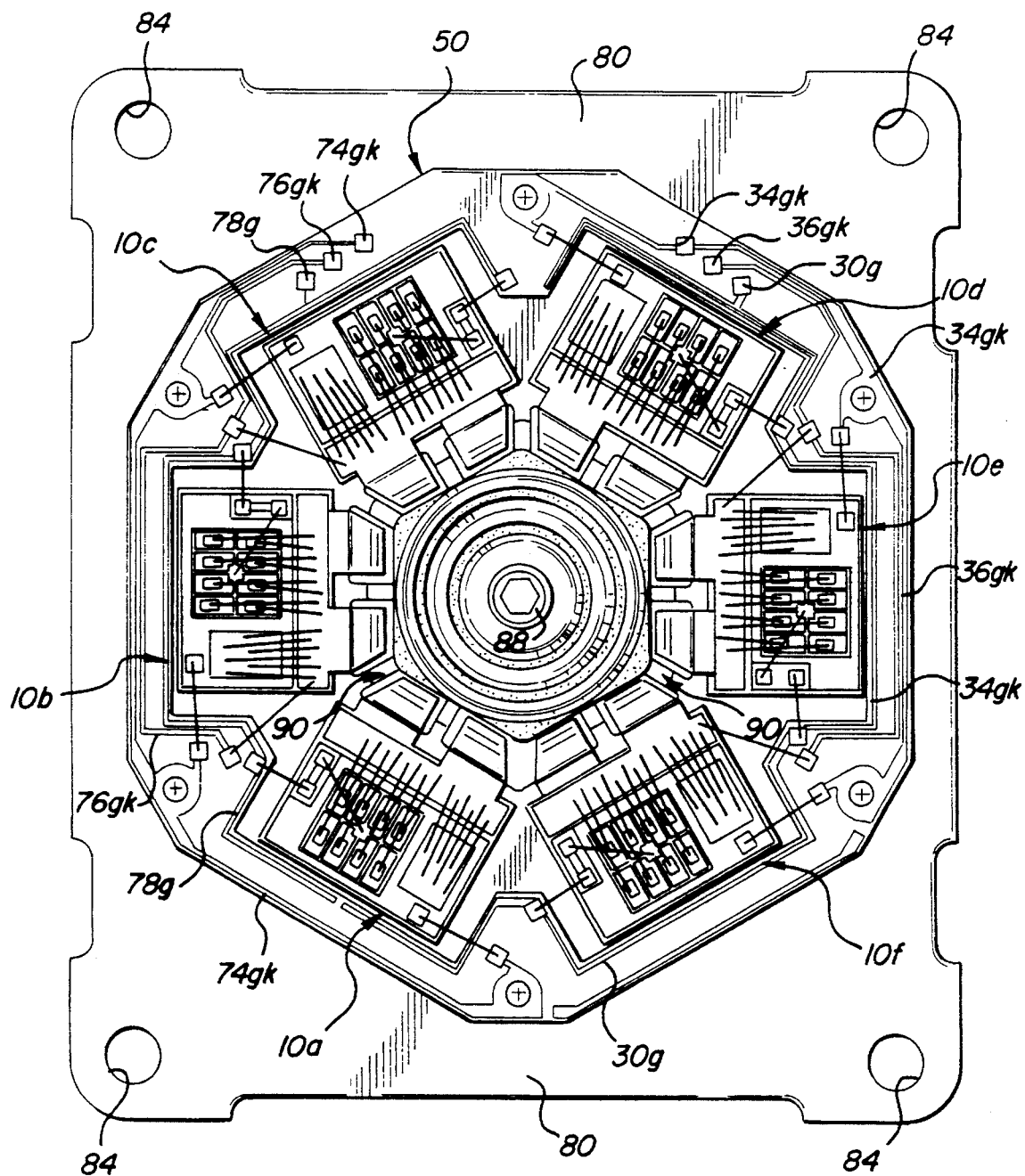
FIG. 8 shows a top plan view of the module baseplate shown in FIG. 7 after a generally annular circuit board member is affixed to the baseplate coaxially with the triaxial terminal subassembly and the circular array of switching transistor substrate subassemblies.
Figure 9:
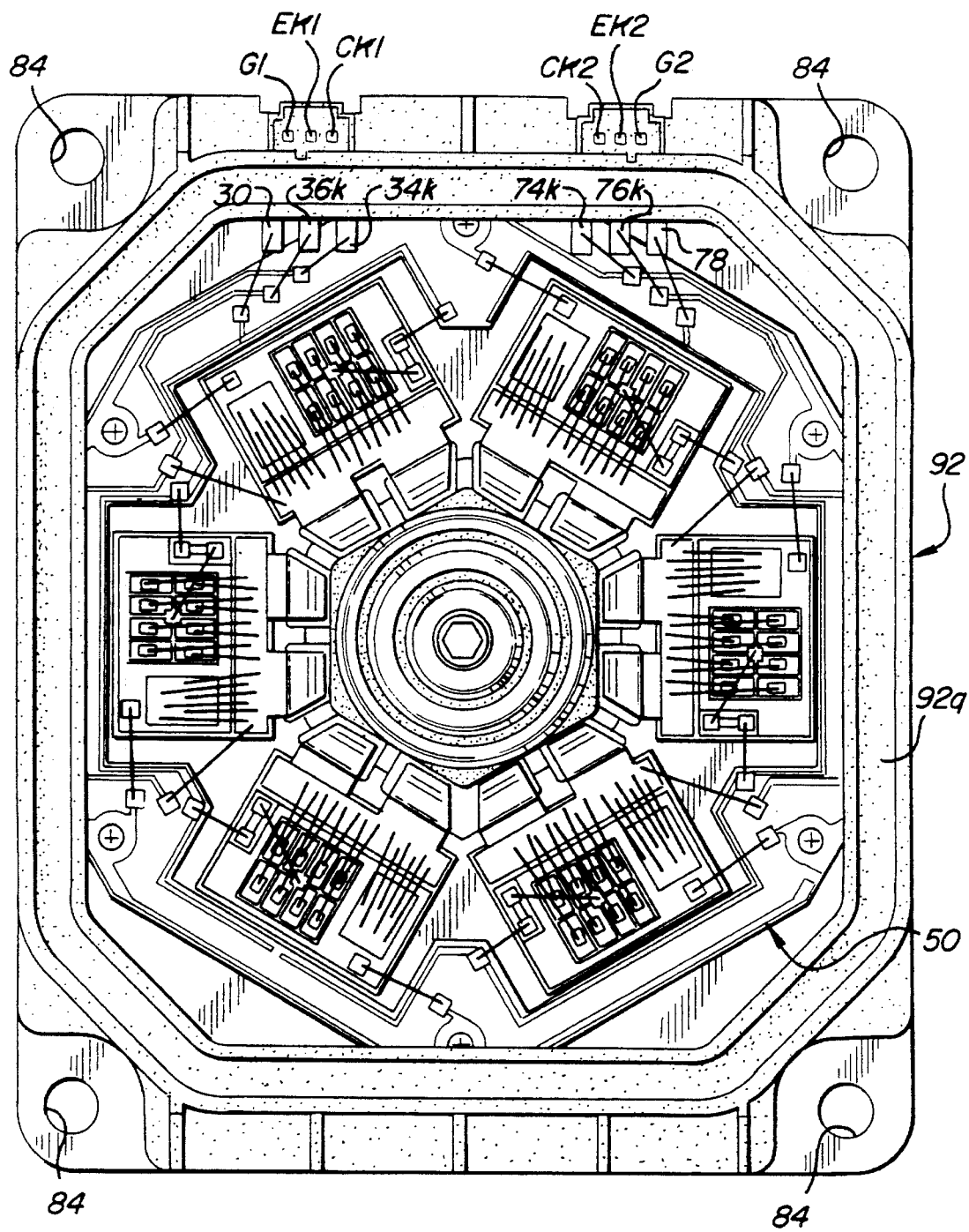
FIG. 9 show a top plan view of the module baseplate shown in FIG. 8 after a housing member is also affixed to the surface of the baseplate.

Wire bond plate 22 is present to facilitate bonding of an aluminum filamentary wire to copper plate 14. If the filamentary wire that is bonded is of aluminum, it is preferred that the small metal plate 22 have an aluminum outer surface. Small metal plate can be of an aluminum/copper laminate with the copper side soldered face down on the outer surface of copper plate 14. On the other hand, it is recognized that small metal plate 22 could be of any material that is metallurgically compatible with the filamentary connecting wire used. Analogously, the lower surface of small metal plate 22 can be of any material compatible with the process used to bond plate 22 to upper copper plate 14. The filamentary bonding wires are shown in FIGS. 8 and 9 of the drawing.

Resistor chip 32 can be a preselected resistance or a trimmable resistance, as is desired. A trimmable resistor can be formed of a ceramic wafer on which a thick film of cermet resistance material is printed. For an IGBT power transistor having a die size of about 9.8 millimeters×9.8 millimeters, a trimmable resistor having a nominal printed resistance of about 4 ohms (trimmable to about 7.5 ohms) can be used. More will be hereinafter said about these last mentioned items.

For completeness, it is mentioned that the surface of IGBT switching transistor 18 is divided into a multiplicity of rectangular aluminum electrode or contact areas, i.e., "wire bond" areas, to reduce emitter series resistance. The rectangular contact areas form generally uniformly spaced emitter contacts on the IGBT surface. In this example, there are eight such areas. They surround a smaller rectangular aluminum alloy gate electrode or contact area 26. The back side (not shown) of the chip 18 forms a collector region for the IGBT switching transistor 18, which region is in low resistance electrical communication with copper plate 14, as by soldering or the like. A single filamentary wire is adequate for gate lead contact because the gate lead does not carry significant current.

The emitter region of the diode chip 20 is its entire upper surface, which is metallized to have an electrode thereon of aluminum alloy suitable for wire bonding. The lower surface (not shown) of diode chip 20 is soldered to the upper surface of copper plate 14. Accordingly, the cathode of chip 20 and the collector of the switching transistor 18 are electrically paralleled.

Reference is made again to the preselected or trimmable resistance chip 32. It could be disposed on the top copper foil layer 15. It is preferably on middle copper foil layer 14 to make its "wire bond" surfaces closer to the level of the surface of copper foil layer 15. Still further, one may choose not to include resistance chip 32 at all in the substrate subassembly 10. It could be disposed on the module baseplate, as shown in the module of the previously mentioned U.S. Ser. No. 08/118,112 (5922-00011; H-172191). However, in most instances we believe it would be preferable to include the resistance element 32 in the substrate subassembly, so that it could be "wire bonded" to the central contact 26 on chip 18 while other "wire bonds" to chip 18 are being made. It should be mentioned that it may be preferred to bond filamentary wires to only some of the emitter contact areas of IBGT chip 18. Then, a wire is bonded between resistor chip 32 and the central contact 26 of IGBT chip 18. After that, filamentary wires are bonded to the rest of the emitter contact areas of IGBT chip 18. As indicated above, central contact 26 of IGBT chip 18 is the gate contact for this chip. It may not be necessary to trim the resistor of resistor chip 32 to any particular value before testing substrate subassembly 10 before mount on a module baseplate. One may choose to reserve this trim until after final assembly. In such pre-testing, the end of the resistor on chip 32, to which the aforementioned "wire bond" is made, would be probed to supply operating gate voltage to gate contact 26 on transistor chip 18. If the resistance value is preselected well, no trim made be needed of resistance 32 at all, even after final assembly.

The end of tab 14a is at a lower level on substrate subassembly 10 than that of tab 15a, whereby they might conveniently contact terminal elements at different levels. However, as previously indicated, the ends of tabs 14a and 15a could be made to be coplanar if the terminals they were to contact were coplanar. In either event, one can respectively clamp the separate input and output test terminals to the ends of tabs 14a and 15a to conveniently test the substrate subassembly 10 at full power (if the substrate subassembly it is attached to is properly cooled).

If not yet mounted on the module baseplate, the substrate subassembly would have to be clamped to a cooling substrate for significant power testing. After testing the substrate subassemblies can be sorted. Such testing and sorting is more precise if the substrate subassembly can be tested at full power. The manner in which the substrate subassembly 10 is tested is not important to this invention.

It should be mentioned that it is preferred to also use a soft, fast silicon semiconductor diode (SFD) 20 on substrate 10 to support the IGBT chip 18. SFD chip 20 is not considered to be an insulated gate device, or a high powered semiconductor switching transistor. The SFD support function to an IGBT is known and forms no part of this invention. The SFD chip 20 forms a blocking diode across the emitter collector terminals of the switching transistor. It is used to protect the switching transistor 18 by shunting current from temporarily reversed voltages that may occur in the system in which this switch is used. The transistor chip 18 and diode chip 20 are preferably made of substantially similar semiconductor material, and by substantially similar processes so that they can have substantially similar performance characteristics, including change in initial characteristics with change in temperature. Still further, each shunting diode, or SFD, 20 is disposed in close thermal proximity to its switching transistor 18 so that the pair would experience a similar temperature environment. This aids in providing more consistency in operation of the resulting electrical switch that they comprise.

Figure 10:
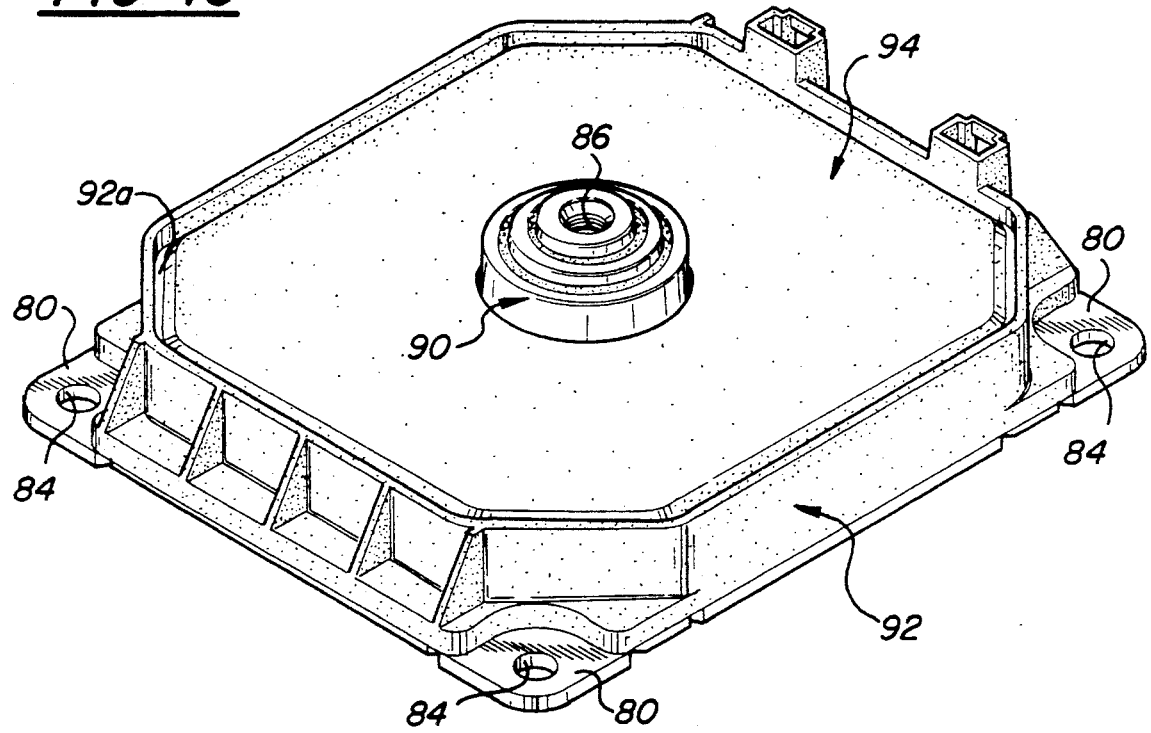
FIG. 10 shows a perspective view of the module of FIG. 9 after a cover is added to the housing member on the module baseplate.
Figure 11:
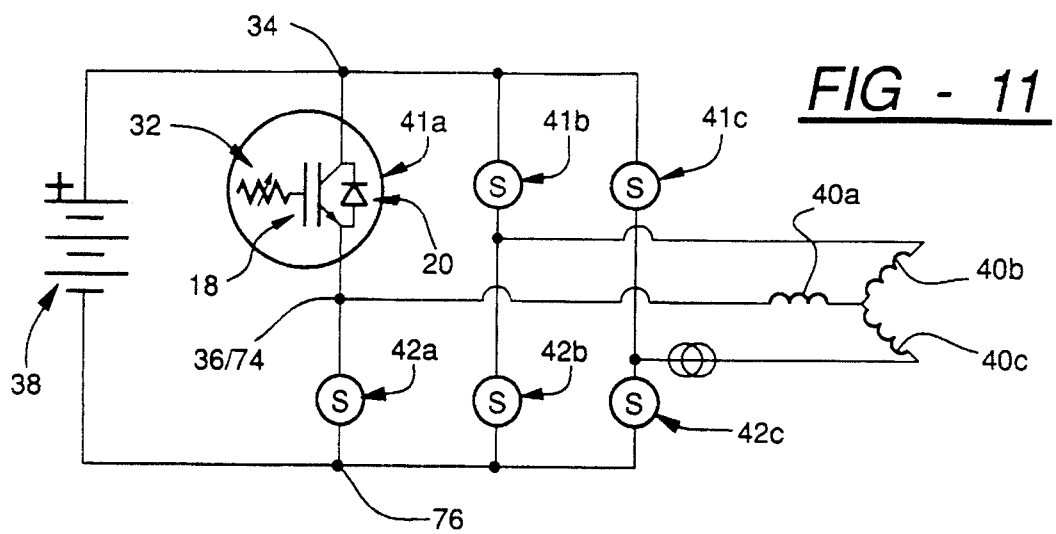
FIG. 11 shows an electrical schematic of a three phase DC to AC inverter which uses three of the triaxial double switch modules illustrated in FIGS. 6–10.

In further background, FIG. 11 shows an electrical schematic of a three-phase inverter circuit that converts direct current (DC) from a battery 38 to alternating current (AC) for use by a alternating current motor 40. As it can be seen, each of the three motor windings 40a, 40b and 40c is connected between a pair of switching transistors, or a pair of two groups of electrically paralleled switching transistors. The transistor, or group of such transistors, forming a single switch on the high side is separately indicated by each of reference numerals 41a, 41b, or 41c. The transistor, or group of such transistors, forming a single switch on the low side is separately indicated by each of reference numerals 42a, 42b, or 42c. Each such switch 41a, 41b, 41c, 42a, 42b, or 42c can be one substrate subassembly such as hereinbefore described. Alternatively, each such switch can be a group of such substrate subassemblies, such as shown in FIGS. 6–9 and 12. For example one switch could comprise IGBT(SFD) groups 18a–18c and the other comprise 18d–18f. For clarity of illustration only one transistor/diode pair and its associated terminal resistance is shown in the enlarged area of FIG. 11. In FIGS. 6–10 and 12, the IGBT(SFD) group 18a–18c is intended to represent switch 41a and the IGBT(SFD) group 18d–18f is intended to represent switch 42a. However, this also would correspond to the switch pairs 41b/42b or 41c/42c. The module shown in FIGS. 6–10 contains such a pair of switches. For this reason the module described herein is referred to as a double or dual switch.

As indicated above, when IGBTs are used for such switches, they cannot be satisfactorily used by just turning them on and off once for each cycle they are to cover. These devises turn "on" hard, which produces a square wave, not a sine wave. To get appropriately configured sine wave output, IGBTs are turned "on" and "off" very rapidly, many times during each sine wave cycle, using increasing and then decreasing gate voltage and pulse width modulation. Turn on/turn off frequencies of 20,000–30,000 Hz are not unusual for automotive traction motor applications. As previously indicated, the parasitic capacitance associated with such rapid switching is so significant that it has heretofore prevented high power IGBTs from being extensively used. Modules incorporating IGBTs to be used at high power have to have a low inductance and a critical balance in total impedance, as hereinbefore described. This invention provides such characteristics in a more economical and reliable manner, which manner is suitable for high volume commercial production.

Others might think that the paralleled transistors in a given switch group should be mounted on a common ceramic substrate. However, as indicated above, if all the paralleled transistors are mounted on a common substrate, capacitance increases. Also, the substrate becomes unduly large in area and complexity. Masking of a large substrate for selective metallization may be required to reduce capacitance effects. The large area tends to increase parasitic capacitance between the top metallized surface of the ceramic substrate and a conductive backplate on which it will be disposed. The large area may also preclude use of beryllium oxide, even though its higher thermal transfer rating might allow a higher current rating and/or produce a lower parasitic capacitance in the resulting module. Increased complexity, that would be inherent to the large substrate, reduces yields of the large substrate, and thereby increases its cost.

Each switching transistor is disposed on its own ceramic substrate. As indicated above, this is used to minimize total substrate area. However, this provides still another benefit. If the substrates are relatively small, substantially the entire substrate surfaces can be metallized, without appreciably increasing parasitic capacitance. This eliminates masking for metallization. Elimination of masking, further reduces cost. Yields of transistor groups will increase, because imperfect one-transistor/substrate combinations or subassemblies can be discarded or easily repaired before the groups are formed. In addition, the mounting of a smaller substrate onto the housing bottom plate is easier, and more readily fixable if the initial mount is not satisfactory. Accordingly, yields can increase still further. Increased yields, of course, mean lower cost products, and indirectly superior products.

A corollary to the foregoing is that such cost reductions tend to make use of beryllium oxide even more practical for larger volume use. Hence, the attendant increase in module performance becomes more practical for commercial production applications, and improved products more available to the public.

More specific aspects of substrate subassembly 10, its method of formation, tabs 14a and 15a, and progressive assembly techniques involving substrate subassembly 10 are described and claimed in the related U.S. patent application Ser. No. 08/118,112.

Figure 12:
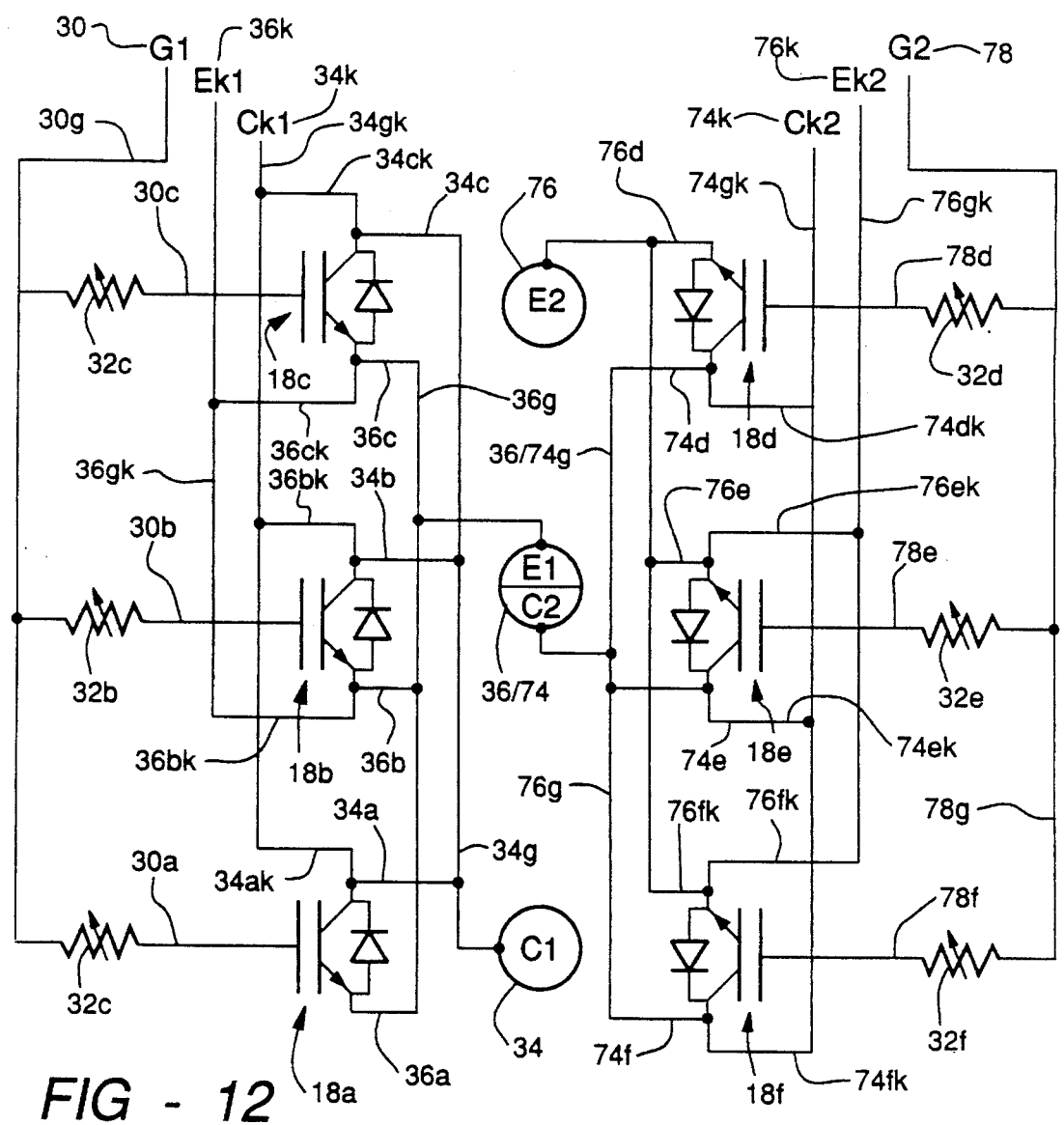
FIG. 12 shows an electrical schematic of the triaxial double switch module of FIGS. 6–10, in which two mutually paralleled groups of transistor/diode pairs comprise two switches.

As indicated above, FIG. 12 shows an electrical schematic of the triaxial double switch of FIGS. 6–10. FIG. 12 shows two three-member transistor/diode groups 18a–18c and 18d–18f. For convenience, the IGBT/SFD pairs are referred to by reference numerals pertaining to the IGBTs themselves. The group comprised of transistor/diode pairs 18a–18c is Group 1. The group comprised of transistor/diode pairs 18d–18f is Group 2. Also for convenience in comparison with the related patent applications referred to above, analogous reference numerals are used in the substrate subassemblies and in the module as a whole.

There are three IGBT/SFD pairs in each group. The IGBT/SFD pairs in each group are electrically in parallel, and form one switch. The transistors and diodes in each group were initially tested and sorted before mounting on their discrete composite substrates. After mounting, each transistor/diode pair was tested and sorted as a pair. Similar pairs were then matched and placed in three-member groups. Two such similar three-member groups were then placed together to comprise IGBT/SFD pairs 18a–18c and 18d–18f. Accordingly, the output characteristics of each substrate subassembly 10, i.e., mounted pair, in each group will be substantially the same, to provide the symmetry discussed above. In addition, it is highly preferred that all the transistors in both groups be the same, to extend the symmetry even further.

Each gate lead for each switching transistor 18a–18f has a pre-selected or trimmable resistance 32a–32f in series with it. If manufacturing variances are small, and transistor/diode matching good, preselected resistance values of resistances 32a–32f may be adequate in the final assembly. However, they may not, and trimming at one or more stages of manufacture may be needed. In the following discussion, for simplicity, we shall refer to resistances 32a–32f simply as "trimmable" resistances.

As mentioned, the electrical schematic in FIG. 12 shows how the three switching transistors, and their associated diodes that form each switch, are electrically paralleled. As previously indicated, only switching transistors having quite similar electrical performance characteristics should be used in each group. In such instance, no one switching transistor will tend to "hog" current, and cause an avalanche failure of the transistor and then of the module. Analogously, care must be taken that all the paralleled transistors are mounted the same, so that they are more likely to be at the same operating temperature.

Further, there can be differences in length, and an attendant variance in voltage drop, in the gate lead 30g to the respective switching transistors 18a–18c and 18d–18f in either or both of Groups 1 and 2 of the module. Even slight differences in such voltage drop can be avoided. The trimmable resistors 32a–32c in the gate lead of the group 18a–18c protect against this difference. The trimmable resistors 32d–32f in the gate lead of the group 18d–18f protect the latter group against this difference. Each of the trimmable gate lead resistors allows the gate voltage supplied to each transistor to be the same. Thus, the "on" resistance characteristics of each switching transistor in the group comprising the resulting module is more likely to be similar. This helps make actual performance of the switching transistors match even more after mount. The trimmable resistor may even be used to adjust operating level of the mounted and assembled group to the level of one switching transistor that results in a lesser performance characteristic than pretesting indicates it should exhibit. Thus, the potential for current "hogging" in the group is reduced even further. Such a resistance can even be used to match the switches paired in an inverter, i.e. switches 41a and 42a, especially if only one or two transistors are used for each switch 41a and 42a.

Figure 4:
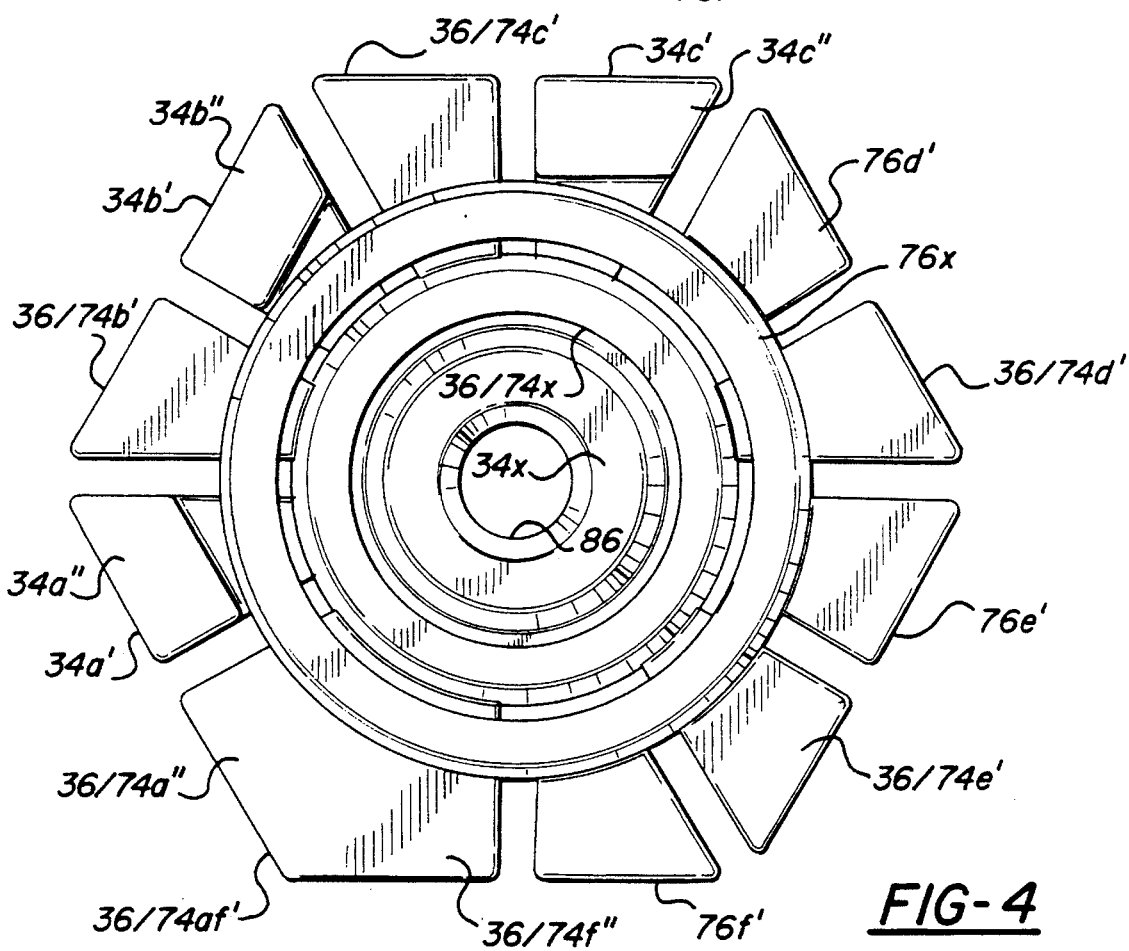
FIG. 4 shows a top plan view of the assembled three concentric power terminal members assembled as shown in FIG. 3.

FIG. 12 can be compared with FIGS. 4 and 13 of prior patent application U.S. Ser. No. 08/118,112 (5922-00011; H-172191). FIG. 4 of the prior U.S. Ser. No. 08/118,112 (5922-00011; H-172191) shows a schematic of a coaxial single switch. FIG. 13 of the prior U.S. Ser. No. 08/118,112 (5922-00011; H-172191) shows a schematic of a linear dual switch. For easy comparison, corresponding reference numerals are used for corresponding parts, as much as is practical. This may leave some intermediate reference numerals unused in this patent application.

As mentioned, the Group 1 IGBT/SFD pairs 18a, 18b and 18c, and their associated resistances 32a, 32b, and 32c, represent switch 41a of FIG. 11. The Group 2 IGBT/SFD pairs 18d, 18e and 18f, and their associated resistances 32d, 32e, and 32f represent switch 42a of FIG. 11. The transistors in Group 1 have collector leads 34a, 34b and 34c, which are connected to collector buss 34g. The Group 1 collector buss 34g is connected to collector terminal 34, which is labelled C1. The gate leads for each of 18a, 18b, and 18c respectively connect with trimmable resistances 32a, 32b and 32c. Trimable resistances 18a–18c connect with gate buss 30g that, in turn, is connected to gate terminal 30. Gate terminal 30 is labelled G1. Emitter leads 36a, 36b and 36c connect with buss 36/74 that, in turn, connects with terminal 36/74. This terminal is labelled E1/C2 to connote that this terminal is the emitter terminal for the Group 1 pairs. It is also the collector terminal for the Group 2 pairs, as will later be described. Collector Kelvin leads 34ak, 34bk and 34ck connect with collector Kelvin buss 34gk. Collector Kelvin buss 34gk is connected to collector Kelvin terminal 34k, which is labelled Ck1. Emitter Kelvin leads 36bk and 36ck connect to emitter Kelvin buss 36gk. Emitter Kelvin buss 36gk is connected to emitter Kelvin terminal 36k, which is labelled Ek1.

The Group 2 transistors 18d, 18e and 18f have collector leads 74d, 74e and 74f. It can been seen that the Group 2 collector leads 74d, 74e, and 74f are connected to the same buss 36/74g as the Group 1 emitter leads 36a, 36b and 36c. Accordingly, terminal 36/74 functions as an emitter terminal for the Group 1 transistors, and as a collector terminal for the Group 2 transistors. The emitter leads 76d, 76e and 76f for the Group 2 transistors have their own buss 76g, which is connected to the Group 2 emitter terminal 76. Group 2 emitter terminal 76 is labeled E2.

Since it is intended that the transistors in Group 1 will be in the "on" condition when the transistors in Group 2 are in the "off" condition, and vice versa, a separate gate control electrode is needed for each group. Accordingly, the Group 2 transistors have their own gate terminal 78, gate buss 78g and gate leads 78d, 78e and 78f. As with Group 1, each of gate leads 78d, 78e and 78f respectively have laser trimmable variable resistance 32d, 32e and 32f in series with them. They connect to Group 2 gate buss 78g, which connects with Group 2 gate terminal 7. Group 2 gate terminal 78 is labelled G2.

Group 2 emitter Kelvin leads 76ek and 76fk and an emitter Kelvin buss 76gk are provided that connect with the separate Group 2 emitter Kelvin terminal 76k. Group 2 emitter Kelvin terminal 76k is labelled Ek2. Separate Group 2 collector Kelvin leads 74dk, 74ek and 74fk and a collector Kelvin buss 74gk are provided that connect with the separate Group 2 collector Kelvin terminal 74k. Group 2 collector Kelvin terminal 76k is labelled Ck2.

The Group 2 collector leads 74d, 74e and 74f connect to buss 74g, which connects with terminal 34/74, as indicated above. Since terminal 36/74 is an emitter terminal for Group 1 and a Collector terminal for Group 2, it is labelled E1/C2.

Reference is now made to the actual constructions of the composite terminal subassembly and the module of this invention. FIG. 1 shows an exploded perspective view of three terminal frame members before the frame members are molded into a composite unitary terminal subassembly. FIG. 2 shows the exploded terminal frame members in plan view. We refer to the terminal members as frame members or flange-like members. This emphasizes their special configurations and plate-like flange portions radially projecting from a central cylindrical portions of the members.

More specifically, the lower terminal frame member in FIGS. 1–2 is identified by reference numeral 34 and by the designation C1. It is the innermost of the concentric terminal members. It has a central cylindrical portion 34x and a short circumferential flange 34y. Extending from short circumferential flange 34y are three spaced integral enlarged flange portions 34a', 34b' and 34c'. The integral enlargements 34a', 34b' and 34c' are highly contoured finger-like projections.

Finger projections 34a', 34b' and 34c' outer ends with flat upper faces 34A", 34B" and 34C" that are disposed in a common plane. Projections 34A', 34B' and 34C' are sized and radially oriented to fit between analogous cooperating projections on terminal members 36/74 and 76. Terminal member 34 is of copper, so as to provide low electrical resistance and high thermal conductivity, as well as easy formability and bondability. The highly contoured finger flanges 34a', 34b' and 34c' are integral with the copper central portion and are generally similarly shaped, effective to provide an electrical symmetry among them.

Figure 7:
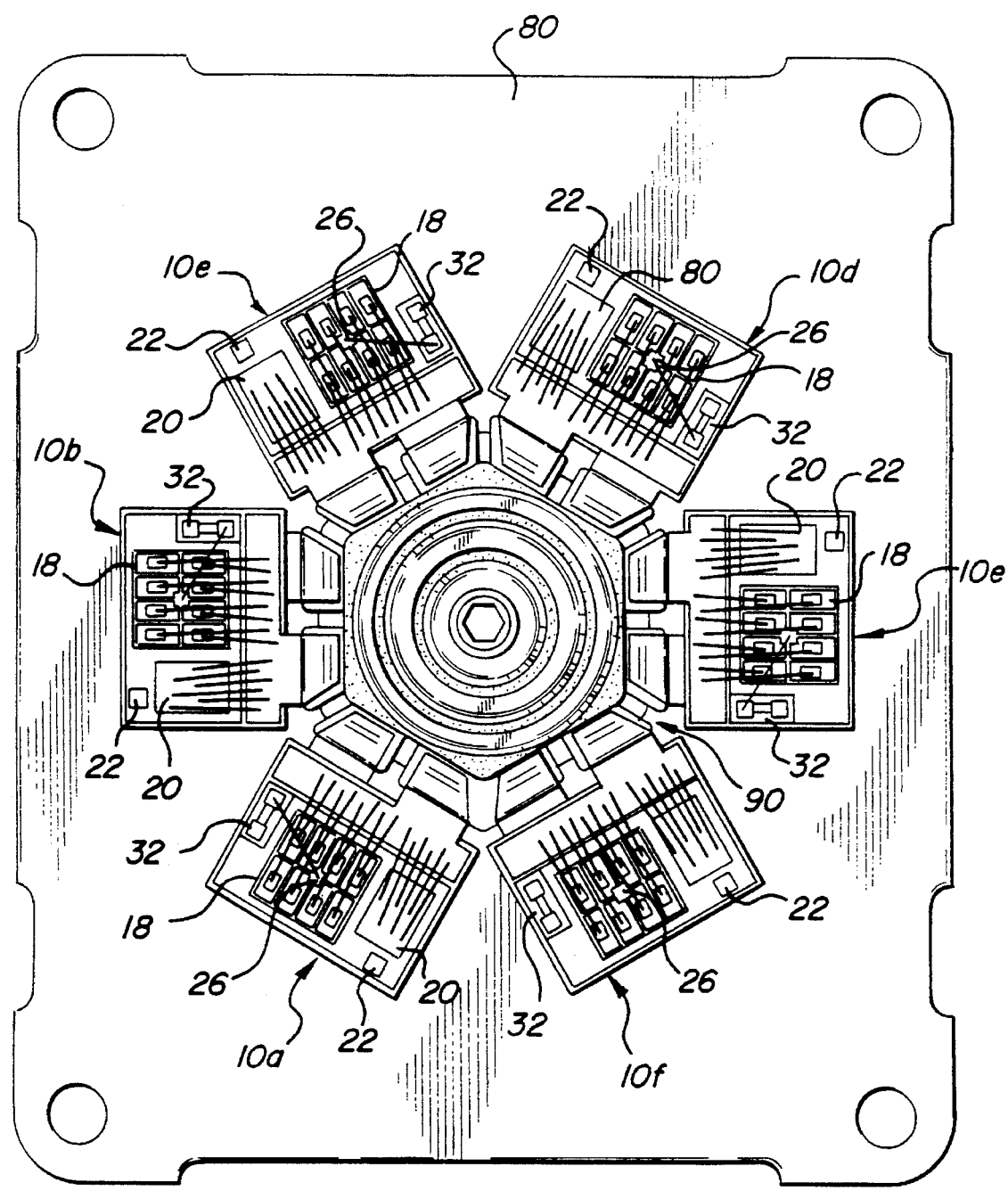
FIG. 7 shows a top plan view of the module baseplate shown in FIG. 6 with the triaxial terminal subassembly of FIG. 5 also affixed to the baseplate.

The center of terminal member 34 has a bore 86 that is chamfered at the top and threaded just below the chamfer. A bolt 88 is threaded into the top of the bore, as shown in FIGS. 7–9. Bolt 88 can be used to clamp a buss assembly (not shown) to the top of the resulting composite terminal member subassembly.

The bore 86 for the clamping bolt 88 extends down to near the lower end of terminal member 34, where it is of reduced diameter (not shown). The reduced diameter section of the central bore forms a circumferential internal shoulder (not shown) on the bore. The bore 86 extends out the lower end of terminal member 34. A second bolt (not shown), of smaller diameter that the first, can be disposed in the bore with its head against the shoulder and its threaded end projecting out of the lower end of the terminal member 34. Then, the second bolt can be used to clamp the terminal member, and the module of which it is a part, to a support.

The terminal member shown in the middle of FIGS. 1–2 is indicated by reference numeral 36/74, as in the related cases. It has a dual electrical function, as in the related cases, and is designated as E1/C2. It has a dual function in that it serves as the Group 1 emitter terminal connection and also as the Group 2 collector terminal connection.

Middle terminal 36/74 has a central tubular portion 36/74x and five integral flange plates of fingers 36/74b', 36/74c', 36/74d', 36/74d' and 36/74af. The finger-like flange portions 36/74b'–36/74af are flat flange-like finger members having flat upper surfaces that form connector plates lying in a common plane. These flange-like fingers or plates are not highly contoured in a direction parallel to the central portion's axis. This is because the upper surfaces of these flange-like finger members establish a plane that contact surfaces 34a"–34c" will align with in the assembly specifically shown in FIGS. 3–5 of the drawing.

In the radial and circumferential directions, flange fingers 36/74b'–36/74af are highly contoured and have configurations complementary to the configurations of flange fingers 34a'–34c'. It should be noticed that the flange members 36/74b'–36/74af are sized and radially positioned to nest with the flange members 34a'–34' of terminal 34 and with analogous flange members on upper terminal 36. The sizing and radial disposition is such that when the flanges are nested, they are uniformly closely spaced around the circumference of the central cylindrical members 34x, 36/74x, and 76x. They have to be spaced to function as separate terminal members. However, in order for the terminal member subassembly to have low inductance, they should be spaced closely, as for example 1–2 millimeters. Analogously, the central tubular portion 36/74x has an inner diameter that is slightly larger than the outer diameter of the central portion 34x of the lower or inner terminal 34, allowing it to nest coaxially without touching it. Actually, the close spacing should be a small as practical for the manufacturing tolerances involved and the operating voltages that are involved. For high voltages, the dielectric strength of the spacing plastic may be the determining factor as to how close the spacing can be between the terminal members in the composite assembly. These spacing comments are also applicable to sizing and spacing of the central cylindrical portions 34x, 36/74x and 76x. As hereinbefore indicated, close spacing between 34x and 36/74x and between 76x and 36/74x is especially important because of their relatively large areas of overlap.

The flange plates, or flange fingers, 36/74b' and 36/74c' are exclusively for emitter contacts, i.e., connection with substrate subassembly tabs 15a, of Group 1. The flange plates, or flange fingers 36/74d' and 36/74e' are exclusively for collector contacts, i. e., connection with the substrate subassembly tabs 14a, of Group 2. The flange plate, or flange finger 36/74af is twice as wide as the others. It is doubly wide because it serves as a contact for two tabs, not just one. It serves as the contact for connector tab 15a of substrate subassembly 10a of Group 1. It also serves as a contact for the connector tab 14a of substrate subassembly 10f of Group 2. Hence, it is both an emitter contact for both Group 1 and a collector contact for Group 2. It is to be understood that terminal flange 36/74af could have been made as two separate terminal flanges. However, we prefer to form the two as a combined single flange.

Reference is now made to the upper terminal member shown in FIGS. 1–2, which is indicated by reference numeral 76. It is also designated as E2. Terminal member 76 has a central tubular portion 76x and three integral flange-like plate or finger elements 76d', 76e' and 76f'. As with the flanges on terminal members 34 and 36.74, flange fingers 76d'–76f' are sized and radially arrayed to closely nest with the flanges of terminal members 36/74 and 34 without contacting them. Analogously, the central tubular portion 76x has an inner diameter that is slightly larger than the outer diameter of the central portion 36/74x of the center terminal E1/C2, allowing it to nest coaxially without touching it.

Still further it should be noticed that the terminal flanges 76d'–76f' are integral with the center portion 76x. however, they do not extend radially from the main body of the center portion 76x. Instead there is a short integral portion 76y depending from the lower edge of the main body of 76x. The short portion 76y has a dimension, in a direction parallel to the axis of tubular portion 76x, that is slightly greater than the thickness of the flanges 36/74b'–36/74af. It is slightly greater because of the spacing between center portions 36/74x and 76x. Hence, flanges 76d'–76f' appear stepped down from the main body of tubular portion 76x.

The central portions 34x, 36/74x and 76x are actually not precisely cylindrical. They are slightly tapered, as is required for formability by shaping dies. The result is that they are slightly frustoconical. If desired, one could make them more frustoconical. We prefer not to. Analogously, they do not have to be perfectly cylindrical in any given radial cross section. However, symmetry should be preserved, even if they were made generally square in radial cross section. All such structures should be considered to be concentric cylinders for purposes of this invention.

FIGS. 3 and 4 show the terminal members 34, 36/74 and 76 nested together in the afore-mentioned closely spaced but non-contiguous disposition. All of the contact surfaces on the ends of the finger flanges are aligned in a common plane. Also, there is a significant overlap and parallelism between the central portions, and a close parallel spacing of finger portions in a common plane. There is also a symmetry not only in composition but also in general shape and size. Paired connector fingers of the terminals have at least complementary shapes and sizes. As previously indicated, this parallelism and symmetry provide means for obtaining low electrical inductance in the resultant module, as well as increased performance, quality and durability.

Figure 5:
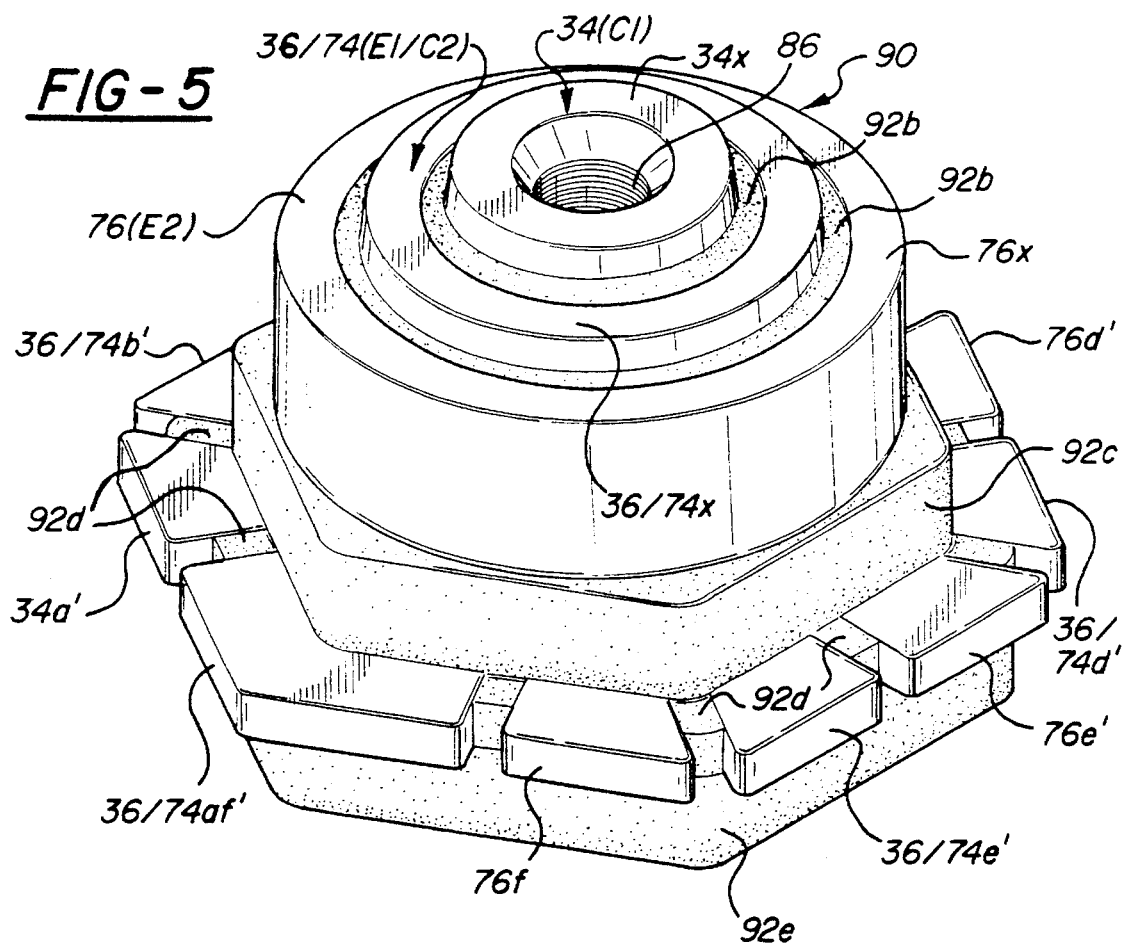
FIG. 5 shows a perspective view of the FIGS. 3 and 4 assembled terminal members after being molded in plastic to form a triaxial terminal member subassembly.

FIG. 5 shows the terminal member subassembly of FIGS. 3–4 after being molded with plastic. We refer to this as the completed terminal member subassembly. In it, terminal members C1, E1/C2 and E2 are concentric and coaxial, and the finger flanges of the upper and lower terminal members locate between the finger flanges of the middle terminal member. We refer to this nested disposition of finger flanges as interdigitation. Counter flow of current in closely spaced and parallel emitter-collector pairs provides reduced inductance in this module for the reasons hereinbefore explained.

As indicated above, molding the terminal members in an electrically nonconductive plastic is a highly preferred technique for maintaining the terminal frame members C1, E1/C2 and E2 in close and fixed disposition. This provides a unitary and pretestable subassembly that can readily be assembled into a module, as shown in FIG. 5. On the other hand, it is recognized that there may be other ways of maintaining the terminal members in close disposition. Accordingly, we do not believe that our invention should be limited to a molded subassembly.

In assembling the terminal member subassembly, it is convenient to use electrically nonconductive plastic members as spacers. The spacers can be washers, sheets, or conforming structures, as is desired. For example, one nonconductive plastic spacer could be used between the outer diameter of 34x and the inner diameter of 36/74x and another between the lower end surface of 36/74x and the upper surface of 34y. In the alternative, both spacers could be formed as a single spacer having a conforming configuration. Spacers with other conformations can be used to facilitate proper circumferential spacing of the terminal members too.

Analogously, a first spacer could be used between the outer diameter of 36/74x and the inner diameter of 76x. A second spacer could also be used between lower end surface of 76x and the upper surfaces of flanges 36/74b'–36/74af, alone or combined with the first spacer. The spacers could be of other electrically non-conductive materials.

As can be seen in FIG. 5, in the molded assembly, it can be seen that all of the flange fingers are short, spaced, and in a common plane. Plastic 92a spaces C1 and E1/C2 but also bonds them together in fixed relationship, to form a unitary pretestable subassembly. The premolded terminal subassembly 90 forms a unitary part that can be assembled into the module in a single step. Importantly, it can be pretested before assembly into the module. This not only simplifies module assembly but also increases module yields. The result is a higher quality module at lower cost. In addition, as indicated above, the coplanar finger tips provide still another manufacturing simplicity.

Analogously, plastic 92b spaces E1/C2 and E2, and bonds them together in the spaced relationship. Plastic surrounding 76x can have any radial conformation, we prefer that it uniformly expose contact surfaces on the upper ends of the terminal finger pairs. A projection of plastic 92d is shown at the finger roots. This projection can extend along the entire interface between finger flanges, if desired. It can be deleted if finger spacing is maintained. The plastic 92e that surrounds the bottom portion of the terminal members subassembly 90 can have any conformation that is convenient. In FIG. 6, it can be seen that the bottom plastic conformation 92e is generally dictated by the conformation of the space within the array of switching transistor substrate subassemblies.

The finger tips of the finger flanges, and the upper ends of the tubular portions 34x, 36/74x and 76x can be clamped against mold surfaces during molding. In this way, the finger tips and the upper ends of the terminal members will not be covered with plastic when the plastic is injected into the mold to form the unitary terminal body 90. Mold conformations can locate between the fingers to help maintain them in predetermined spacing disposition during molding. Hence, our terminal member subassembly is easily moldable into a composite unitary subassembly.

Terminal tabs 14a and 15a of all the substrates can be made coplanar, their ends placed on terminal member coplanar contact areas, and concurrently bonded to them in a single operation. We prefer electron or laser beam welding over soldering. A fixture and technique for electron beam or laser beam welding to the tabs to the contact areas is described and claimed in the above-mentioned U.S. patent application Ser. No. 08/233,572. Our composite terminal subassembly is not only easily moldable but easily tested, easily assembled into a module and easily electrically connected to components therein. It provides a complex function in a simple unitary product. This simplicity not only enhances yields, but also enhances reliability and durability, all of which is desirable for high volume commercial manufacturing.

Reference is now made to FIG. 6 which shows a rectangular module baseplate 80, having a plurality of switching transistor substrate subassemblies 10a–10f bonded to its upper surface in a symmetrical circular array. The array is coaxial with a central hole 82 in baseplate 80. Switching transistor substrates subassemblies 10a, 10b, and 10c comprise a first electrical switch, referred to herein as the Group 1 switch. Switching transistor substrate subassemblies 10d, 10e and 10f comprise a second switch, referred to herein as the Group 2 switch. Substrate subassemblies 10a–10f, and their respective connector tabs 14a and 15a, are circumferentially spaced to correspond to finger flange contact areas on the composite terminal member subassembly 90. Thus, one needs only to "wipe" connector tabs 14a and 15a onto the respective contact areas to position them for welding.

For completeness of disclosure herein, it is mentioned that the substrate subassemblies 10a–10f are initially bonded to baseplate 80 with terminal tabs 14a and 15a bent up, as shown in FIG. 6. This permits easy contact for full power testing of the bonded array prior to further assembly of the module. Once a pretested and acceptable baseplate/substrate subassembly combination have been formed, the pretested and acceptable terminal subassembly 90 is added to the baseplate 80. It is centrally disposed on the baseplate coaxially with the circular array of substrate subassemblies 10a–10f and baseplate center hole 82. It is positioned on baseplate 80 so that contact areas of its finger flanges are aligned with connector tabs 14a and 15a of the substrate subassemblies 10a–10f. Composite terminal member subassembly 90 can be adhesively bonded to the baseplate 80 with a flexible silicone adhesive such as Dow No. 6611. After the terminal member subassembly 90 is bonded in place, the terminal tabs 14a and 15a are "wiped" over their respective terminal member contact areas to bend them in place for bonding. "Wiping" the thin terminal tabs 14a and 15a may be all that is necessary to properly position the thin tabs for bonding, as hereinbefore mentioned. If not, a fixture can be used to hold them in place for bonding. If they are to be bonded by laser or electron beam bonding in accordance with the aforementioned U.S. patent application Ser. No.

08/233,572, the fixture can have a cylindrical center portion with a peripheral circumferential flange covering the substrate subassemblies and their connector tabs. An opening could be provided over central portions of the tabs to provide access for laser or electron beam welding. The plate would cover the substrate subassemblies to protect them from welding flash.

Baseplate 80 is a rectangular plate about 2–4 millimeters thick and of a highly thermally conductive material that has a thermal expansion coefficient approaching that of silicon. One might think that metal would preferred as baseplate 80, because of its high thermal conductivity. However most high thermal conductivity metals also have a relatively high coefficient of expansion. Silicon has a relatively low coefficient of expansion. Large differences in the coefficient of expansion are objectionable, since they develop stress in the resultant product. Metals having a thermal expansion coefficient close to that of silicon, such as Fernico, Kovar, Invar and the like, also have relatively low thermal conductivity. We prefer to use composite materials for base plate 80. They can be laminated, or of other constructions. Such materials are more desirable for this application because they are designed to have thermal expansion matching silicon, and relatively high thermal transfer properties. The most attractive of such composites for our application are metal/ceramic composites. Since they include metal, they are generally electrically conductive, which we believe is a strong asset in our particular application. Such a composite baseplate offers significant benefits to the module of the subject invention, even though each silicon switching transistor is disposed on its own, discrete, ceramic substrate, as was previously described.

We have found a metal/ceramic composite that can be quite effectively used on our application. It not only can be made to have high thermal conductivity but also relatively low in rate of expansion. We prefer to use a composite material that has a coefficient expansion somewhat close to that of silica. More precisely, however, we want the composite baseplate 80 to closely match the coefficient of expansion of the composite substrate subassemblies 10*a*–10*f*. We want the substrate subassembly to be quite similar to silicon but recognize that it may not be an exact, precise match. If the substrate subassembly coefficient of expansion does not exactly match that of silicon, than we prefer that the thermal expansion coefficient of the baseplate 80 match that of the substrate subassemblies, not that of silicon. As indicated, we prefer that the baseplate 80 be electrically conductive and solderable. Many metal/composites are commercially and experimentally available. If not inherently solderable, they should be treated to make them solderable, at least in the areas where the substrate subassemblies are to be mounted. This enhances thermal conduction between the substrates of 10*a*–10*f* and the baseplate 80.

As mentioned above, when a substrate subassembly 10 is soldered to a larger conductive support, the effective area of the substrate's lower copper plate 16 is increased. This enlarges parasitic capacitance. In turn, if the larger conductive support is supported directly on a still larger area, such as an aluminum heatsink member, parasitic capacitance increases even more. Using dielectric materials to space these items apart is usually not desirable because it usually reduces thermal transfer. Hence, increased thickness of dielectric materials is usually not considered desirable. We have found one metal/ceramic composite that is particularly effective when used as baseplate 80. It is sold under the designation MCX-693 by the Lanxide Corporation of Newark, Del. It has a coefficient of expansion of about 5–12 ppm per degree centigrade, we prefer 6 ppm per degree centigrade, which is almost exactly the same as that of the Cu/BeO/Cu sandwich we use as a composite substrate material in substrate subassemblies 10*a*–10*f*. This is close to that of silicon, which is about 3.2 ppm per degree centigrade. The MCX-693 material is essentially a combination of metal and ceramic in which the metal retains its identity sufficiently to provide high thermal conductivity. The ceramic retains its identity sufficiently to lower expansion coefficient but not thermal conductivity. We have found that the MCX-693 composite material additionally has fairly good mechanical strength, thus it can serve as the baseplate itself, not as a support thread, which illuminates an additional transfer interface. It forms a rugged module assembly. Further it can be coated or plated to make its surface solderable.

Still further, the MCX693 material has sufficient strength to allow it to be made as a hollow body. this allows the baseplate 80, itself, to also function as a cooling member. In such instance, baseplate 80 need not be mounted on a heatsink for cooling. It need only be mounted on a mechanical support analogous to what might be used for supporting the heatsink. This not only eliminates costs due to an additional member in the resulting system but eliminates a heat transfer interface. Eliminating a heat transfer interface, and its inherent losses, improves cooling. Improved cooling, in turn, allows the switching transistors to be operated at higher power levels.

The Group 1 substrate subassembly collector connector tabs 14*a* are soldered or welded to the contact surfaces 34*a*", 34*b*" and 34*c*" of the composite terminal member subassembly 90. The Group 1 substrate subassembly emitter connector terminal tabs 15*a* are soldered or welded to the upper surfaces of finger flanges 36/74*b*' and 36/74*c*' and also to the surface 36/74*a*" of the enlarged finger flange 36/74*af*. Analogously the Group 2 substrate subassembly collector connector tabs 14*a* are soldered or welded to the upper surface of finger flanges 36/74*d*' and 36/74*e*' and to the contact surface 36/74*f*" of terminal finger flange 36/74*af*. The Group 2 substrates subassembly emitter connector tabs 15*a* are soldered or welded to the upper surface of finger flanges 76*d*', 76*e*' and 76*f*'.

The module could be tested at this stage of assembly but the aforementioned bonding process is of high reliability. Accordingly, it may be satisfactory to defer testing at this module assembly stage until the next stage of manufacture.

Reference is now made to FIG. 8, which shows the next stage of manufacture. In FIG. 8, a ring-like printed circuit board member 50 is bonded to baseplate 80 surrounding substrate subassemblies 10*a*–10*f*. The ring-like printed circuit board member 50 is bonded to baseplate 80 by means of silicone adhesive Dow No. 6611. The ring-like circuit board number 50 contains a gate conductor 30*g*, an emitter Kelvin conductor 36*gk* and a collector Kelvin conductor 34*gk*, all for the Group 1 substrate subassemblies 10*a*–10*c*. The ring-like circuit board element 50 also contains a gate conductor 78*g*, an emitter Kelvin conductor 76*gk* and a collector Kelvin conductor 74*gk*, all for the Group 2 substrate subassemblies 10*d*–10*f*. Ultrasonically or thermocompression bonded filamentary wires form the electrical connections between the foregoing conductors and the associated terminals and the associated parts of the substrate subassemblies 10*a*–10*f*. They are as shown in FIG. 8.

It should be noted that the ring-like circuit board member 50 can be of the typical FR-1 epoxy/glass circuit board material that supports a copper layer which is defined into a conductor pattern. However, it can also be a porcelainized steel substrate on which a thick film cermet conductor pattern is printed. It should also be mentioned that the gate lead on the circuit board for each of the substrates of assemblies 10a–10f is wire bonded to one end of the chip resistor 32 on the substrate subassembly. The other end of the chip resistor is of course bonded to the center contact 26 on the switching transistor. It should be mentioned that it is preferred to dispose the terminal resistance 32 on the substrates of assembly. However, it is recognized that the chip resistor could alternatively be located on the ring-like circuit printed circuit board member 50. However a longer wire bond to the center contact 26 of the switching transistor would be required. It should also be noted that if the terminal resistance 32 is located on the substrate subassembly, a short conductor is disposed between contact 26 and terminal resistance 32, thus providing a greater assurance that the contact 26 on each of the switching transistors receives the same "turn on" voltage.

If circuit board 50 is of porcelainized steel, resistor chips would not necessarily be used. Instead the trimmable resistors 32a–32f could be integrally included in the circuit board 50 and integrally interconnected with gate conductors 30g and 78g. This provides an advantage in that a soldered or filamentary wire connection with the gate lead 30g or 78g is eliminated, along with a discreet resistor chip. As mentioned above, this advantage would be offset by requiring a longer wire bond between the resistor and the contact area 26 on the switching transistor.

Collector Kelvin connections for each of Group 1 and Group 2 are made of a bonding filamentary wires between the metal chip 22 on each substrates of assembly and a respective bond pad on circuit board 50. Each bond pad would be part of a separate collector Kelvin pattern on the circuit board. The filamentary wires can be of aluminum and ultrasonically bonded. Emitter Kelvin connections for each of Groups 1 and 2 are analogously made between the top copper layer 15 on the substrate subassemblies and an associated connector pad on the circuit board member 50. A separate conductor pattern for the emitter Kelvin pads of each Group is provided. It can be seen in FIG. 8 that no circuit board bonding pad is provided on the top copper layer 15 of the substrate subassemblies. If desired, a bonding pad, such as bonding pad 22 on layer 14, could be used on the upper copper layer 15, to enhance wire bondability.

FIGS. 7–9 show a bolt 88 threaded into the center bore 86 of portion 34x of center terminal member 34. As indicated above, bolt 88 can serve as a means for affixing a three layered buss member (not shown) to the upper ends of the terminal cylinders 34x, 36/74x and 76x. On the other hand, other configurations on the upper ends of the terminal cylinders 34x, 36/74x and 76x can be contemplated, whereby the buss members can be separately bolted to each of these members. For example, the upper end of each of the terminal members 36/74 and 76 can have one or more integral radial enlargements (not shown) of their respective central portions 36/74x and 76x. Each radial enlargement could have a threaded bore, to receive a bolt for clamping a separate buss member to them. The particular technique by which the buss might be affixed to the upper ends of the cylinders 34x, 36/74x and 76x can vary widely, as is convenient and/or as is needed in any given application.

The module can easily be tested at full power in the form shown in each of FIGS. 7 and 8, if adequate cooling is provided, and rejects discarded or repaired. After it is tested and found acceptable, a housing member 92 is added to the assembly, as shown in FIG. 9. Housing member 92 is an annuler but generally rectangular non-conductive plastic member that is adhesively bonded to baseplate 80 surrounding the substrate subassemblies 10a–10f and the terminal member subassembly 90. The same silicone adhesive referred to above can be used.

Housing member 92 includes two groups of three embedded terminal conductors that permit external connection to the circuit board 50. The outer ends of the embedded terminal members are square in cross section and of small dimension. They are each bent up to a position perpendicular to the plane of the baseplate. In this way, a separate three-contact female-type connector can be pushed onto the outer ends of each trio of embedded terminal members from above the module.

The inner end of each embedded terminal member is broadened into a relatively wide blade-like member within the housing that is parallel to the major surface of baseplate 80. This provides a broad surface parallel to the upper surface of the baseplate for bonding of a filamentary wire. The filamentary wire is used to interconnect each embedded terminal member to a selected location on the circuit board. The external portions of the Group 1 embedded terminal members, that form connector sites, are designated G1, Ek1 and Ck1. The interior portions of these terminal members are respectively indicated by reference numerals 30, 36k and 34k. As indicated above, they are respectively bonded to wire bond contact pads on the circuit board for gate lead 30g, emitter Kelvin 36gk and collector Kelvin 34gk.

The second group of three embedded terminals is similar to the first group described above. The second group has external connector sites designated as Ck2, Ek2 and G2. The internal extensions of these conductors are respectively designated as 74k, 76k and 78. These interior extensions are wire bonded to contact pads on circuit board 50 for the Group 2 substrate subassemblies respectively for collector Kelvin 74gk, emitter Kelvin 76gk and gate 78g conductors.

Housing 92 leaves the corners of baseplate 80 exposed where mounting holes 84 are located. On the other hand, as shown in some of the related patent applications, bolt holes 84 can be covered by the housing 92 and mounting bolts pass through holes in the housing as well as holes 84 in the baseplate 80.

It should also be mentioned that if desired, a spring washer (not shown) can be used under the head of each corner mounting bolt (not shown), and center bolt 88. Spring washers help maintain a constant pressure between the baseplate 80 and its support during thermal cycling, without inducing too much mechanical stress in them.

Housing 92 has a cover 94. Cover 94 has a circumferential lower lip (not shown) on its periphery that cooperates with a continuous circumferential channel 92a in the upper surface of housing 92. Channel 92a is filled with silicone adhesive, to bond cover 94 to housing 92. The adhesive used can be as described above.

The completed module, including housing 94, is shown in FIG. 10. As seen in FIG. 10, cover 94 has an opening through which the upper end of the composite terminal subassembly 90 projects. Any plastic suitable for semiconductor applications can be used for the composite terminals of assembly 90, the housing 92 and the cover 94.

After final assembly is substantially completed, but cover 94 is not yet in place, the housing 92 is preferably filled with a silicone resin or oil to passivate it. The silicone resin or oil also provides some mechanical protection. The filling is not shown because it is optional and its function is well known. Moreover, showing it would tend to obscure the new and different important features of the invention. Cover 94 can have apertures (not shown) to fill, or complete filling, of the housing 92 after the cover 94 is installed.

It is recognized that this invention is described in connection with certain specific embodiments. On the other hand it is understood that the basic principles of this invention can take the form of many other embodiments without departing from the spirit of this invention. It is intended that the claims not be limited to the precise embodiments herein disclosed, but only limited as expressly recited in the claims hereof.

The embodiments of the invention in which an exclusive property or privilege is claimed are defined as follows:

1. A semiconductor double switch module having reduced inductance and adapted for commercial manufacture, said module comprising:

a housing having a baseplate and defining a chamber;

a low electrical resistance highly contoured first terminal member disposed in said chamber, said first terminal member having a cylindrical first terminal portion and also having a radially extending first flange portion, said cylindrical first terminal portion having an axis, said first flange portion having a highly contoured first circumferential edge with an outer extremity providing a first contact area that has an arcuate length, said first contact area being radially spaced from said first terminal portion axis a first predetermined distance, effective to substantially provide a predetermined low electrical resistance between said first contact area and said cylindrical first terminal portion, and further effective to substantially provide a given inductance in said cylindrical first terminal portion with respect to a given electrical current flow;

a low electrical resistance highly contoured second terminal member disposed in said chamber, said second terminal member having a cylindrical second terminal portion and also having a radially extending second flange portion, said cylindrical second terminal portion having an axis, said second flange portion having a highly contoured second circumferential edge with an outer extremity providing a second contact area that has an arcuate length, said second contact area being radially spaced from said second terminal portion axis a second predetermined distance, effective to substantially provide a predetermined low electrical resistance between said second contact area and said cylindrical second terminal portion, and further effective to substantially provide a predetermined inductance in said cylindrical second terminal portion with respect to said given electrical current flow;

a low electrical resistance highly contoured third terminal member disposed in said chamber, said third terminal member having a cylindrical third terminal portion and also having a radially extending third flange portion, said cylindrical third terminal portion having an axis, said third flange portion having a highly contoured third circumferential edge with an outer extremity providing a third contact area that has an arcuate length, said third contact area being radially spaced from said third terminal portion axis a predetermined distance, effective to substantially provide a predetermined low electrical resistance between said third contact areas and said cylindrical third terminal portion and to further substantially provide a given inductance in said cylindrical third terminal portion with respect to a given electrical current flow;

a triaxial disposition of said first, second and third cylindrical terminal portions on a common axis, wherein the cylindrical portion of the second terminal member concentrically surrounds the cylindrical portion of the first terminal member and the cylindrical portion of the third terminal member concentrically surrounds the cylindrical portion of the second terminal member, whereby the cylindrical portions of the first and second terminal members have a common axis and a significant axial overlap, and the cylindrical portions of said second and third terminal members have significant axial overlap;

at least two insulated gate semiconductor switching devices disposed in said chamber adjacent said triaxially disposed terminal members, with one of said devices in close radial proximity to said first and second contact areas and the other of said devices in close radial proximity to said second and third contact areas;

low electrical resistance connections between said devices and said contact areas, whereby input and output electrical current of each device can flow through an adjacent pair of said concentric cylindrical terminal portions at substantially equal rates but in opposite directions;

a close spacing between said concentric cylindrical terminal portions, effective to allow the inductances of paired cylindrical terminal portions to significantly negate one another.

2. The module as defined in claim 1 wherein the predetermined distance between the terminal member axis and terminal member contact areas on each terminal member is the same.

3. The module as defined in claim 1 wherein each of the first, second and third contact areas is in a single plane perpendicular to said axis.

4. The module as defined in claim 2 wherein: each highly contoured circumferential edge on each terminal member flange defines at least one finger extending away from said common axis;

the contact area of each terminal member is on the end of the flange finger of that terminal member; and the flange fingers are circumferentially spaced about said common axis.

5. The module as defined in claim 4 wherein said contact areas are substantially in the same plane.

6. The module as defined in claim 5 wherein said insulated gate semiconductor switching devices are insulated gate bipolar transistors.

7. The module as defined in claim 3 wherein:

said first terminal member flange has a plurality of circumferentially spaced and outwardly extending fingers, each of which has a first contact area on an outer end thereof;

said third terminal member flange has a plurality of circumferentially spaced and outwardly extending fingers, each of which has a third contact area on an outer end thereof; and said second terminal member flange has a plurality of circumferentially spaced and outwardly extending fingers, each of which has a second contact area on an outer end thereof, which fingers and second contact areas are circumferentially spaced complementary to spacing of fingers and associated contact areas of said first and third terminal members.

8. The module as defined in claim 7 wherein said fingers are interdigitated.

9. The module as defined in claim 8 wherein:

said contact areas are all the same radial distance from said common axis; and said contact areas are coplanar.

10. The module as defined in claim 8 wherein the first contact areas are in a plane other than that occupied by root sections of the first flange fingers;

the third contact areas are in a plane other than that occupied by root sections of the third flange fingers; and the second contact areas lie in a plane at least close to a plane occupied by root sections of the second flange fingers.

11. The module as defined in claim 10 wherein:

said second and third cylindrical portions are tubular;

all of said contact areas are substantially the same predetermined distance from said common axis; and said first second and third contact areas are all in the same plane perpendicular to said axis, effective to define a circle of alternating emitter and collector contact areas.

12. The module as defined in claim 11 wherein:

all of the contact areas but one have a similar arcuate length:

the one contact area, that does not have the similar arcuate length, has an arcuate length about twice the arcuate length of the others; and the input of one of said devices and the output of the other of said devices both connected to said one contact area.

13. The module as defined in claim 11 wherein said insulated gate semiconductor switching devices are insulated gate bipolar transistors.

14. The module as defined in claim 12 wherein said insulated gate semiconductor switching devices are insulated gate bipolar transistors.

15. The module as defined in claim 2 wherein:

the highly contoured circumferential edge of each of said first, second and third flanges defines a plurality of circumferentially spaced enlargements of about the same radial and circumferential size and shape and of about the same thickness on each of said flanges;

the contact areas are disposed on outer ends of said enlargements;

The enlargements are nested together to form a spaced circular array of alternating input and output contact areas;

each of said insulated gate semiconductor switching devices is an insulated gate bipolar transistor; and each such transistor is disposed on a separate substrate subassembly that is disposed on said housing baseplate.

16. The module as defined in claim 15 wherein: two adjacent enlargements on the second flange are combined as a single enlargement, that is substantially twice the circumferential size of the other flange enlargements;

an output of one switch is connected to one portion of the single enlargement; and an input of the other switch is connected to another portion of the single enlargement.

17. A triaxial pretestable and commercially manufacturable terminal member subassembly of low inductance for a high power and high frequency semiconductor switching module, said terminal member subassembly comprising:

a low electrical resistance highly contoured first terminal member, said first terminal member having a cylindrical first terminal portion and also having a radially extending first flange portion, said cylindrical first terminal portion having an axis, said first flange portion having a highly contoured first circumferential edge with an outer extremity providing a first contact area that has an arcuate length, said first contact area being radially spaced from said first terminal portion axis a first predetermined distance, effective to substantially provide a predetermined low electrical resistance between said first contact area and said cylindrical first terminal portion, and further effective to substantially provide a given inductance in said cylindrical first terminal portion with respect to a given electrical current flow;

a low electrical resistance highly contoured second terminal member, said second terminal member having a cylindrical second terminal portion and also having a radially extending second flange portion, said cylindrical second terminal portion having an axis, said second flange portion having a highly contoured second circumferential edge with an outer extremity providing a second contact area that has an arcuate length, said second contact area being radially spaced from said second terminal portion axis a second predetermined distance, effective to substantially provide a predetermined low electrical resistance between said second contact area and said cylindrical second terminal portion, and further effective to substantially provide a predetermined inductance in said cylindrical second terminal portion with respect to said given electrical current flow;

a low electrical resistance highly contoured third terminal member, said third terminal member having a cylindrical third terminal portion and also having a radially extending third flange portion, said cylindrical third terminal portion having an axis, said third flange portion having a highly contoured third circumferential edge with an outer extremity providing a third contact area that has an arcuate length, said third contact area being radially spaced from said third terminal portion axis a predetermined distance, effective to substantially provide a predetermined low electrical resistance between said third contact areas and said cylindrical third terminal portion and to further substantially provide a given inductance in said cylindrical third terminal portion with respect to a given electrical current flow;

a triaxial disposition of said first, second and third cylindrical terminal portions on a common axis, wherein the cylindrical portion of the second terminal member concentrically surrounds the cylindrical portion of the first terminal member and the cylindrical portion of the third terminal member concentrically surrounds the cylindrical portion of the second terminal member, whereby the cylindrical portions of the first and second terminal members have a common axis and a significant axial overlap, and the cylindrical portions of said second and third terminal members have significant axial overlap; and a close spacing between said concentric cylindrical terminal portions, effective to form a triaxial terminal member subassembly in which inductances of paired cylindrical terminal portions significantly negate one another.

18. The triaxial terminal member subassembly as defined in claim 17 wherein:

said first terminal member flange has a plurality of circumferentially spaced and outwardly extending fingers, each of which has a first contact area on an outer end thereof;

said third terminal member flange has a plurality of circumferentially spaced and outwardly extending fingers, each of which has a third contact area on an outer end thereof; and said second terminal member flange has a plurality of circumferentially spaced and outwardly extending fingers, each of which has a second contact area on an outer end thereof, which fingers and second contact areas are circumferentially spaced complementary to spacing of fingers and associated contact areas of said first and third terminal members.

19. The triaxial terminal member suassembly as defined in claim 18 wherein:

said contact areas are all the same radial distance from said common axis;

said fingers are interdigitated; and all of said contact areas are coplanar.

20. The triaxial terminal member subassembly as defined in claim 19 wherein:

the first contact areas are in a plane other than that occupied by root sections of the first flange fingers;

the third contact areas are in a plane other than that occupied by root sections of the third flange fingers; and the second contact areas lie in a plane at least close to a plane occupied by root sections of the second flange fingers.

* * * * *